(12) United States Patent
Sato

(10) Patent No.: US 7,787,287 B2
(45) Date of Patent: Aug. 31, 2010

(54) MAGNETIC STORAGE DEVICE WITH CURVED INTERCONNECTS

(75) Inventor: Yoshihiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 353 days.

(21) Appl. No.: 11/723,209

(22) Filed: Mar. 19, 2007

(65) Prior Publication Data

US 2007/0159877 A1 Jul. 12, 2007

Related U.S. Application Data

(63) Continuation of application No. PCT/JP2004/013625, filed on Sep. 17, 2004.

(51) Int. Cl.
*G11C 11/00* (2006.01)

(52) U.S. Cl. ........................ 365/158; 257/421; 365/171; 365/173

(58) Field of Classification Search ................. 257/421, 257/422; 365/158, 171, 173, 63
See application file for complete search history.

(56) References Cited

U.S. PATENT DOCUMENTS

| 5,477,482 | A  | * | 12/1995 | Prinz ........................... 365/129 |
| 6,147,922 | A  | * | 11/2000 | Hurst et al. .............. 365/225.5 |
| 6,351,410 | B1 |   | 2/2002  | Nakao et al. |
| 6,815,783 | B2 | * | 11/2004 | Kim et al. .................... 257/421 |
| 6,891,241 | B2 |   | 5/2005  | Kim et al. |
| 6,900,490 | B2 | * | 5/2005  | Asao et al. ................... 257/295 |
| 6,906,947 | B2 | * | 6/2005  | Bloomquist et al. ......... 365/158 |
| 6,992,923 | B2 |   | 1/2006  | Kim et al. |
| 7,064,974 | B2 | * | 6/2006  | Suzuki et al. ............... 365/158 |
| 7,277,317 | B2 | * | 10/2007 | Le Phan ...................... 365/158 |

FOREIGN PATENT DOCUMENTS

| JP | 2000-195251 A | 7/2000 |
| JP | 2001-84758 A | 3/2001 |
| JP | 2003-163334 A | 6/2003 |
| WO | WO 2004068498 A1 * | 8/2004 |

OTHER PUBLICATIONS

International Search Report of PCT/JP2004/013625, date of mailing Dec. 21, 2004.
Translation of the International Preliminary Report on Patentability of International Application No. PCT/JP 2004/013625, with Form PCT/IB/373 and Form PCT/ISA/237, dated Mar. 29, 2007.

* cited by examiner

*Primary Examiner*—Dang T Nguyen
*Assistant Examiner*—Alexander Sofocleous
(74) *Attorney, Agent, or Firm*—Westerman, Hattori, Daniels & Adrian, LLP

(57) ABSTRACT

In an MRAM, a curved region (206) is formed in a bit line (202), and this curved region (206) is in bent shape, with a TMR element (203) serving as a center, in this case, in rough U shape (in the illustrated example, in roughly inverted U shape). The bit line (202) in which the curved region (206) is formed includes the TMR element (203) in a space formed by the curved region (206). Thanks to such relatively simple construction, this construction realizes a highly reliable MRAM which ensures that power is substantially saved during data writing into a memory cell while meeting requirements for further miniaturization of the device.

13 Claims, 18 Drawing Sheets

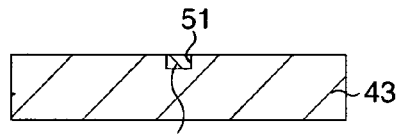
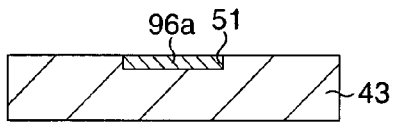
FIG. 16A
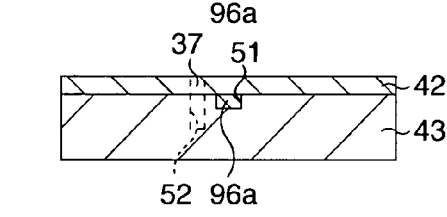
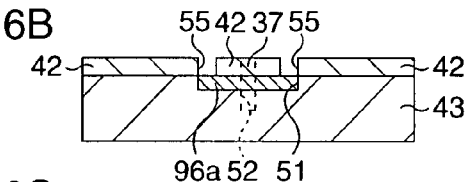
FIG. 16B
FIG. 16C
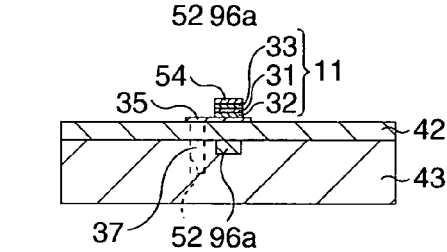
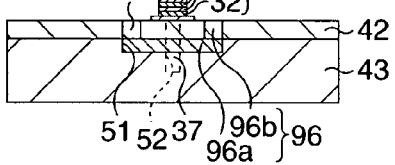
FIG. 16D
FIG. 16E
FIG. 16F
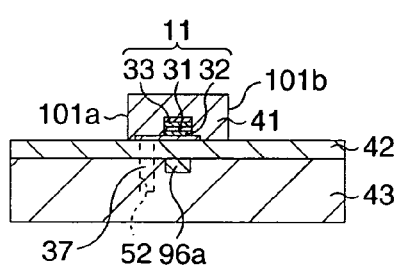
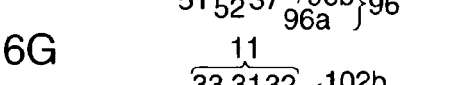
FIG. 16G
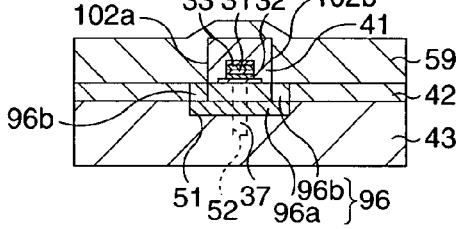

MAGNETIC STORAGE DEVICE WITH CURVED INTERCONNECTS

TECHNICAL FIELD

The present invention relates to a magnetic storage device provided with a magnetic storage element which performs magnetic storage by utilizing changes in magnetization and a method of manufacturing the magnetic storage device, and concretely directs to a so-called MRAM (magneto-resistive random access memory).

BACKGROUND ART

In a magneto-tunnel junction (MTJ) which has two ferromagnetic material layers supporting a thin insulating layer by sandwiching the thin insulating layer, the tunnel resistance changes depending on the angle of mutual magnetization in each of the ferromagnetic material layers. There is what is called an MRAM as a semiconductor storage device in which an MTJ utilizing this tunnel magneto-resistance (TMR) effect is used as a magnetic storage element (a TMR element) and a plurality of TMR elements are arranged as memory cells, for example, in a matrix manner. It is general practice that a word line and a bit line for performing data writing into each TMR element and reading therefrom, and a selection transistor for selecting a desired memory cell are provided as this MRAM. For example, conventional MRAM is described in U.S. Pat. No. 6,815,783, U.S. Pat. No. 6,891,241, and U.S. Pat. No. 6,992,923.

In this MRAM, during data writing, a current is caused to flow through the word line and the bit line by turning the selection transistor off, and the magnetization direction of the ferromagnetic material layer (free layer) of the TMR element is determined by a composite magnetic field generated from the current. During data reading, a current is caused to flow through the bit line by turning on the selection transistor of the relevant memory cell and on/off states are read on the basis of a difference from a reference current value.

Although conventional MRAMs have the advantage that high-speed switching is possible in a non-volatile memory, it has been pointed out that conventional MRAMs are inferior to SRAMs and DRAMs in terms of power consumption because in principle, several milliamperes are required as a current which is caused to flow through the word line and the bit line during data writing. At present, it is considered that it is possible to suppress the current during writing to 1 mA or so by using a structure in which the magnetic flux density is increased by narrowing a design rule to 0.18 μm and besides a clad layer covering these interconnects with a magnetic material is formed, whereby magnetic fluxes can efficiently pass the TMR element. However, in order to further reduce power consumption, it is necessary to bring the interconnects nearer to the TMR element or to apply the free layer with a low inverted magnetic field, and no other effective methods have not been found out. On the other hand, because in association with requests for further miniaturized designs of semiconductor devices, inverted magnetic fields of the TMR element tend to increase abruptly, it becomes more difficult to reduce the current during writing.

SUMMARY OF THE INVENTION

A magnetic storage device of the present invention is constituted by a magnetic storage element which performs magnetic storage by utilizing changes in magnetization and a pair of interconnects which are in mutually twisted positions above and below the magnetic storage element, wherein at least one of the pair of interconnects includes a local curved portion, which is spaced from the magnetic storage element so as to surround the magnetic storage element.

In one aspect of the magnetic storage device of the present invention, the magnetic storage element is a magneto-tunnel junction of at least three-layer construction which has a lower ferromagnetic material layer and an upper ferromagnetic material layer, which sandwich a tunnel barrier layer.

In one aspect of the magnetic storage device of the present invention, the curved portion is formed in the form of a circular arc, with the magnetic storage element serving as a center or in bent shape, with the magnetic storage element serving as a center.

In one aspect of the magnetic storage device of the present invention, the pair of interconnects are such that one has the curved portion and the other is linearly formed or the pair of interconnects are such that both have the curved region.

In one aspect of the magnetic storage device of the present invention, the pair of interconnects are orthogonal to each other as viewed on a plan.

In one aspect of the magnetic storage device of the present invention, the interconnects formed in the curved portion include the magnetic storage element in the interior of a space formed by the curved portion.

In one aspect of the magnetic storage device of the present invention, the magnetic storage device includes a selection element for selecting the magnetic storage element which corresponds to the magnetic storage element.

In one aspect of the magnetic storage device of the present invention, the pair of interconnects are connected to the magnetic storage element so as to support the magnetic storage element by sandwiching the magnetic storage element from above and below.

In one aspect of the magnetic storage device of the present invention, the pair of interconnects lie in the same plane in areas other than the curved region.

In one aspect of the magnetic storage device of the present invention, the pair of interconnects and the magnetic storage element lie in the same plane in areas other than the curved region.

In one aspect of the magnetic storage device of the present invention, a magnetic-film-clad layer is formed so as to cover at least part of the pair of interconnects.

BRIEF DESCRIPTION OF THE DRAWINGS

FIG. 16A is a schematic sectional view which shows a method of manufacturing an MRAM according to the Third Embodiment in order of steps;

FIG. 16B is a schematic sectional view which shows a method of manufacturing an MRAM according to the Third Embodiment in order of steps;

FIG. 16C is a schematic sectional view which shows a method of manufacturing an MRAM according to the Third Embodiment in order of steps;

FIG. 16D is a schematic sectional view which shows a method of manufacturing an MRAM according to the Third Embodiment in order of steps;

FIG. 16E is a schematic sectional view which shows a method of manufacturing an MRAM according to the Third Embodiment in order of steps;

FIG. 16F is a schematic sectional view which shows a method of manufacturing an MRAM according to the Third Embodiment in order of steps;

FIG. 16G is a schematic sectional view which shows a method of manufacturing an MRAM according to the Third Embodiment in order of steps;

DETAILED DESCRIPTION OF THE PREFERRED EMBODIMENTS

Fundamental Gist of the Invention

In order to reduce currents to be supplied, the present inventors thought of changing the shape of interconnects so as to increase the strength of magnetic field in a case where a magnetic storage element, in this case, a magneto-tunnel junction (MTJ) as a TMR element, and arrived at that idea that in at least one of a word line and a bit line, a local curved region spaced from the magneto-tunnel junction is formed so as to surround the magneto-tunnel junction. In order to concentrate magnetic fields at the position of the magneto-tunnel junction, a curved region which is symmetrical with respect to the magneto-tunnel junction is suitable, and it is preferred that the curved region be in the form of a circular arc or in bent shape (for example, in U shape).

Figure 1A:
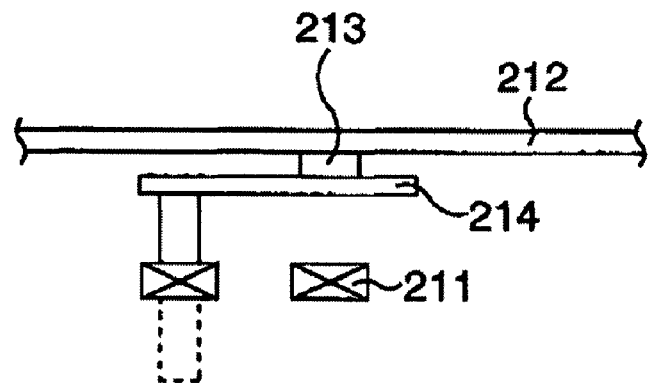
FIG. 1A is a schematic sectional view of a conventional MRAM.

In a conventional MRAM, as shown in FIG. 1A, for the relation among a word line 211, a bit line 212 and a TMR element, which are components of the MRAM, the linear bit line 212 is provided so as to be orthogonal to the linear word line 211 above the word line 211, the bit line 212 and an upper layer of the TMR element 213 are connected between the word line 211 and the bit line 212, and a lower layer of the TMR element 213 and a drain diffusion layer of a selection transistor (not shown) are connected via a lower interconnect 214.

Figure 1B:
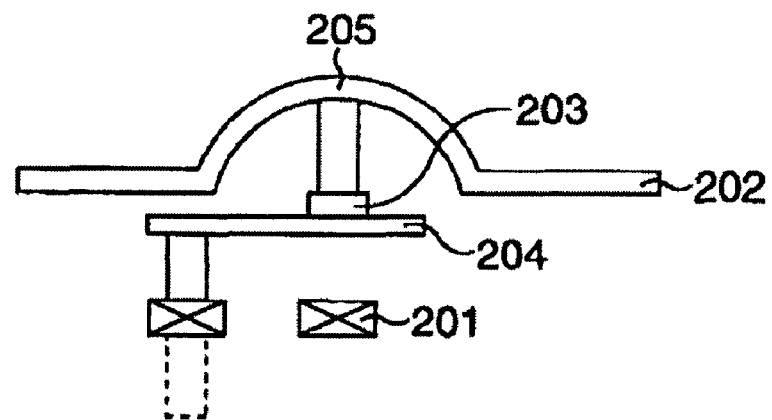
FIG. 1B is a schematic sectional view of an MRAM of the present invention.

In contrast to this, in an MRAM of the present invention, as shown in FIG. 1B, for the relation among a word line 201, a bit line 202 and a TMR element 203, which are components of the MRAM, the linear bit line 202 is provided so as to be orthogonal to the linear word line 201 above the word line 201, the bit line 202 and an upper layer of the TMR element 203 are connected between the word line 201 and the bit line 202, and a lower layer of the TMR element 203 and a drain diffusion layer of a selection transistor (not shown) are connected via a lower interconnect 204.

In this bit line 202, a local curved region (portion) 205 spaced from the TMR element 203 is formed so as to surround the TMR element 203. This curved region 205 is in the form of a circular arc, with the TMR element 203 serving as a center. The bit line 202 in which the curved region 205 is formed includes the TMR element 203 in the interior of a space formed by the curved region 205.

Figure 1C:
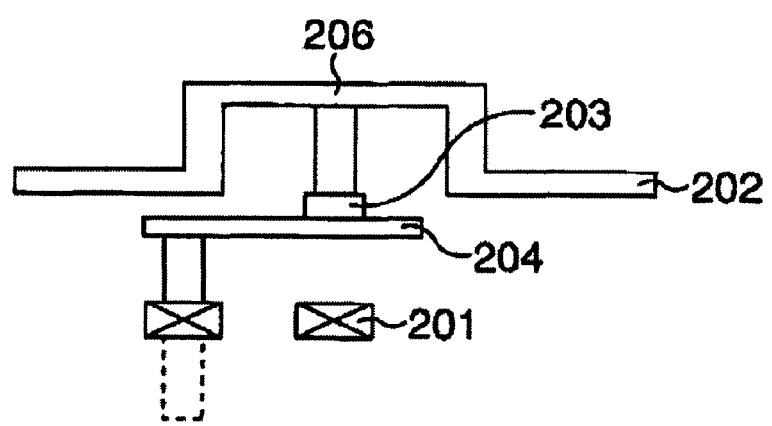
FIG. 1C is a schematic sectional view of an MRAM of the present invention.

In another aspect of the MRAM of the present invention, as shown in FIG. 1C, a curved region 206 is similarly formed in a bit line 202, and this curved region 206 is in bent shape, in this case, in rough U shape (in the illustrated example, in roughly inverted U shape). The bit line 202 in which the curved region 206 is formed includes the TMR element 203 in the interior of a space formed by the curved region 206.

Figure 2A:
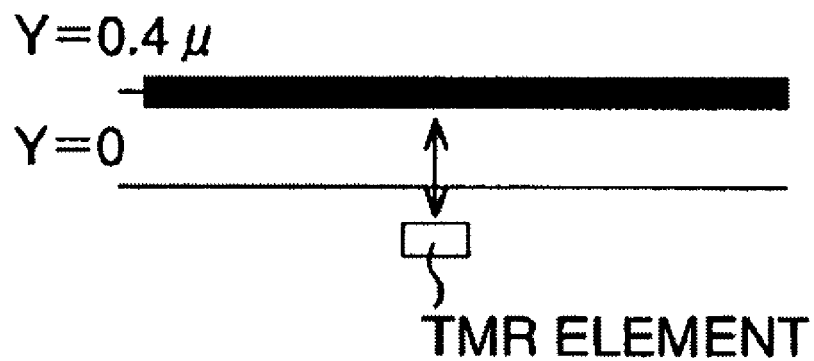
FIG. 2A is a schematic sectional view of a conventional MRAM.
Figure 2B:
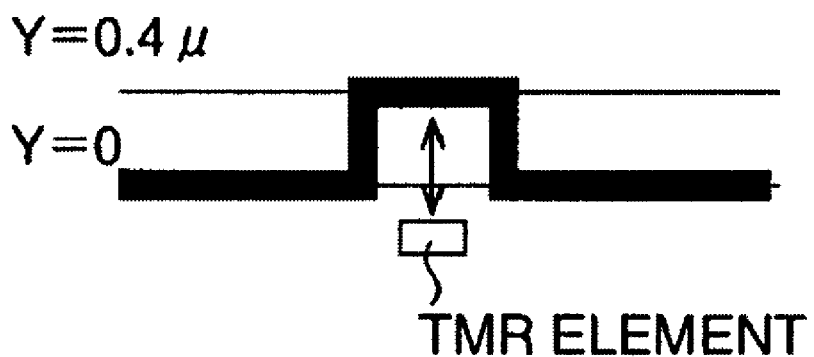
FIG. 2B is a schematic sectional view of an MRAM of the present invention.
Figure 3:
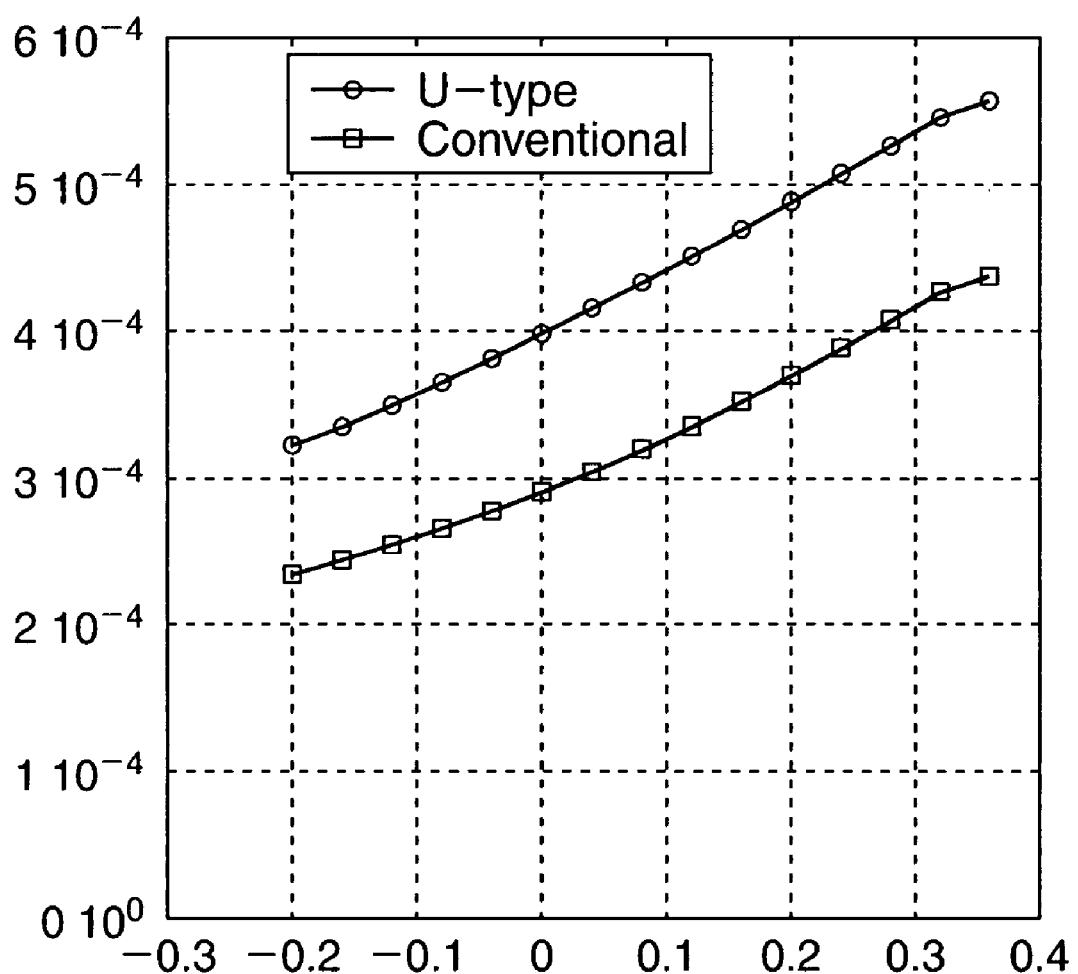
FIG. 3 is a characteristic diagram which shows results of an investigation of the correlation between the positional relationship between a bit line and a TMR element and the intensity of a magnetic field by a 3D simulation.

FIG. 3 is a characteristic diagram which shows results of an investigation of the correlation between the positional relationship between a bit line and a TMR element and the intensity of a magnetic field by a 3D simulation in a comparison between a conventional interconnect structure, in this case, the linear bit line structure (FIG. 2A) shown in FIG. 1A and an interconnection structure of the present invention, in this case, the U-shaped bit line structure (FIG. 2B) shown in FIG. 1C.

For the interconnect structure, in both the conventional example and the present invention, the interconnect width is 0.4 μm, the thickness is 0.2 μm, and the current is 1 mA. In the conventional type (linear type) of FIG. 2A, the distribution of magnetic fields generated under the conditions shows contour lines of an ellipse close to a concentric circle, whereas in the present invention (the U shape) of FIG. 2B, contour lines are dense on the inner side of "U." Thus, the two show different ways in which magnetic fields are applied.

In FIG. 3, for a bit line and a TMR element as shown in FIGS. 2A and 2B, an area 0.2 μm away from the TMR element being at a reference position H=0 μm, the distance H (μm) from the reference position to the bit line is plotted as abscissa and the field strength (Oe) is plotted as ordinate. In FIG. 2B, the distance from the reference position to the U-shaped curved region is H.

As shown in FIG. 3, it is apparent that the field strength in the U type of the present invention of FIG. 2B increases 20% to 30% or so compared to the conventional type shown in FIG. 2A. This means that magnetic fields can be concentrated on the TMR element by providing the U-shaped curved region in the bit line.

Concrete Embodiments to which the Present Invention is Applied

Concrete embodiments to which the present invention is applied will be described in detail with reference to the drawings on the basis of the above-described fundamental gist.

First Embodiment

This embodiment exemplifies an MRAM in which a U-shaped curved region is formed only in a word line and is not formed in a bit line.

(Construction of MRAM)

Figure 4:
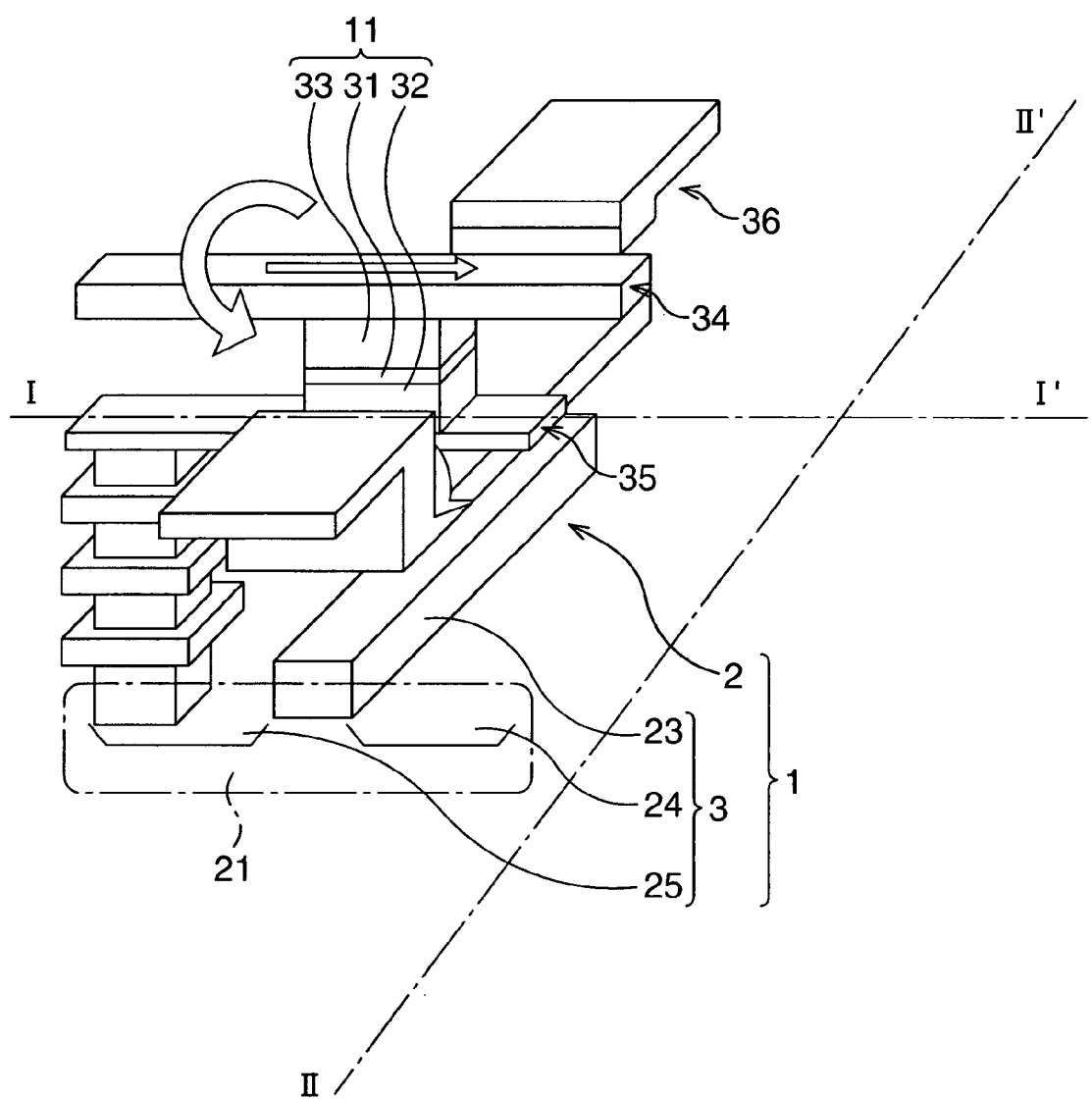
FIG. 4 is a perspective view which shows the general construction of an MRAM according to the First Embodiment.
Figure 5A:
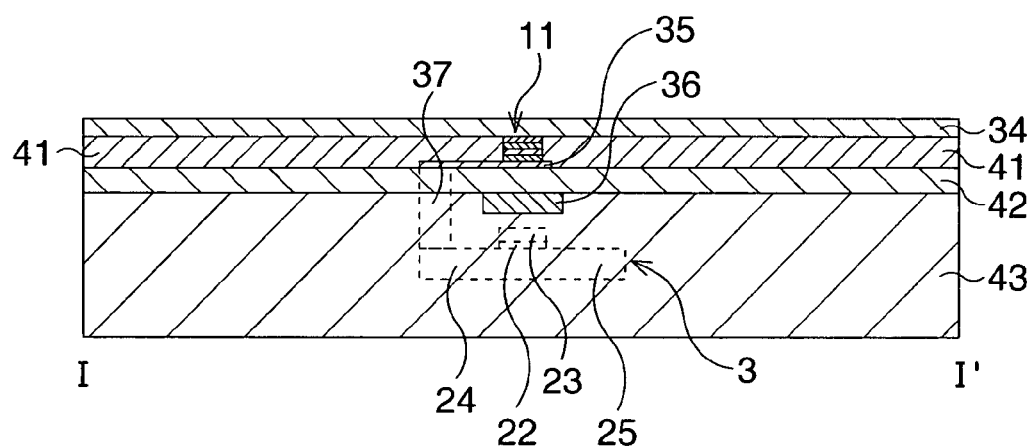
FIG. 5A is a schematic sectional view taken along the line I-I' of FIG. 4.
Figure 5B:
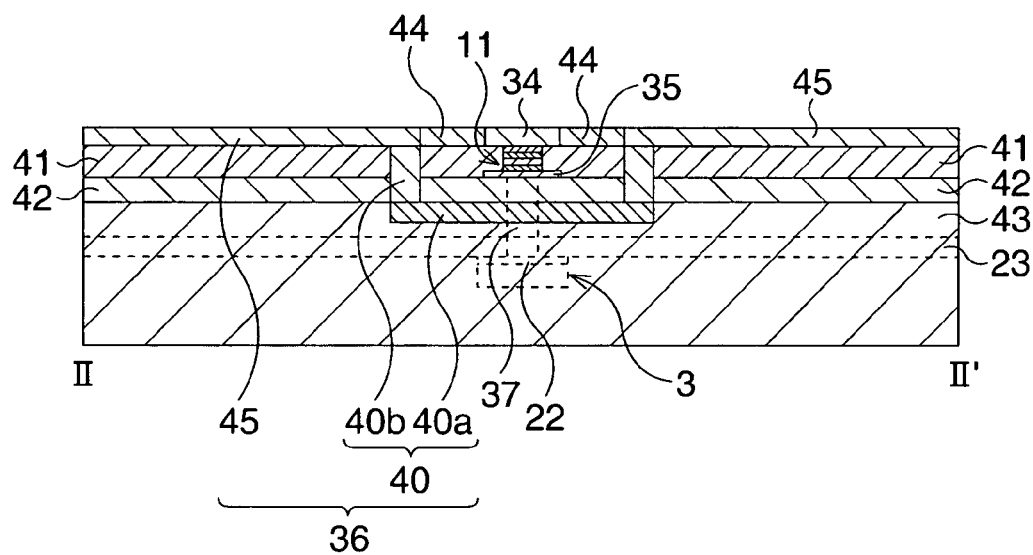
FIG. 5B is a schematic sectional view taken along the line II-II' of FIG. 4.

FIG. 4 is a perspective view which shows the general construction of an MRAM according to the First Embodiment, FIG. 5A is a sectional view taken along the line I-I' of FIG. 4, and FIG. 5B is a sectional view taken along the line II-II' of FIG. 4. In FIG. 4, for the sake of convenience, only one memory cell is shown and the illustrations of various kinds of insulating films and interlayer dielectric films are omitted.

In this MRAM, a plurality of memory cells 1 are disposed, for example, in a matrix manner to form a memory cell array. Each of the memory cells 1 has a memory part 2 provided with a TMR element 11 comprising an MTJ and a selection transistor 3 for selecting a relevant memory cell 1 from the plurality of memory cells 1.

The selection transistor 3 is a pMOS transistor which conforms to a 0.18 μm rule, for example, and is provided with, for example, a gate electrode 23 which is patterned in a strip manner on a silicon substrate 21 via a gate insulating film 22, and a source diffusion layer 24 and a drain diffusion layer 25, which are obtained by introducing a p type impurity into surface layers of silicon thin films 21 on both sides of this gate electrode 23.

The memory portion 2 is provided with the TMR element 11 which has ferromagnetic material layers 32, 33, which support a thin insulating layer 31 by sandwiching the thin insulating layer 31, and is buried in an interlayer dielectric film 41, a bit line 34 which is connected to the ferromagnetic material layer 33 of the TMR element 11 and extends linearly on the interlayer dielectric film 41, a lower interconnect 35 which is patterned on an interlayer dielectric film 42 and connected to the ferromagnetic material layer 32 of the TMR element 11, a word line 36 which extends so as to be orthogonal to the bit line 34, and a W plug 37 which is connected to the lower interconnect 35. A bottom end of the W plug 37 and the drain diffusion layer 25 of the selection transistor 3 are connected, and a top end of the W plug 37 and the lower interconnect 35 are connected. That is, the drain diffusion layer 25 of the selection transistor 3 and the TMR element 11 are connected via the W plug 37 and the lower interconnect 35.

The TMR element 11 is composed, in order from the lower layer, of Ta (40 nm)/PtMn (15 nm)/CoFe (2 nm)/Ru (0.9 nm)/CoFe (3 nm)/AlOx (1.2 nm)/NiFe (6 nm)/Ta (30 nm), for example. Ta is an electrode layer, PtMn is an antiferromagnetic material layer, COFe and NiFe are ferromagnetic material layers, and AlOx is an insulating layer. Therefore, in the illustrated example, the construction is as follows: an electrode layer (not shown)/an antiferromagnetic material layer (not shown), the ferromagnetic material layer 32 (including an Ru layer (not shown), the same applies to the following)/the insulating layer 31/the ferromagnetic material layer 33/an electrode layer (not shown).

It is possible to adopt such a construction that the bit line 24 is divided into two upper and lower parts, which are used separately for writing and for an upper electrode.

In the word line 36, a local curved region 40 spaced from the TMR element 11 is formed so as to surround the TMR element 11. This curved region 40 is in bent shape, with the TMR element 11 serving as a center, in this case, in rough U shape. As shown in FIG. 5B, the curved region 40 is constituted in rough U shape by a bottom portion 40a which is patterned above the gate electrode 23 within an interlayer dielectric film 43 and a W plug 40b which is formed in the interlayer dielectric films 41, 42 on this bottom portion 40a so as to be connected to both ends of the bottom portion 40a. The narrower the gap between the lower interconnect 35 and the curved region 40 of the word line 36, in other words, the smaller the thickness of the interlayer dielectric film 42, the larger the strength of magnetic fields applied to the TMR element 11. In consideration of this fact and ensuring insulating properties, it is preferred that the thickness of the interlayer dielectric film 42 be 100 nm or so.

And a linear region 45 of the word line 36 other than the curved region 40 of the word line 36 is an area which is connected to each of the W plugs 40b on the interlayer dielectric film 41 and extends linearly, and is disposed so as to be orthogonal to the bit line 34 on the interlayer dielectric film 41 in the same hierarchical position with the bit line 34 (on the same plane therewith). That is, the linear region 45 of the word line 36 and the bit line 34 are buried together in an interlayer dielectric film 44 on the same plane. Thanks to this interconnect construction, the number of layers of the memory part 2 decreases, permitting further miniaturization of the memory cell 1, with the result that high-density layouts of the memory cell array and an increase in the strength of composite magnetic fields are realized.

The sizes of the bit line 34, word line 36 and W plugs 37, 40b may be larger than 0.18 μm depending on the integration level of the memory cell. For example, the bit line 34 and the word line 36 may be formed with a width of 0.35 μm or so.

(Method of Manufacturing MRAM)

FIGS. 6A to 6E, FIGS. 7A to 7E, and FIGS. 8A and 8B are schematic sectional views which show a method of manufacturing an MRAM according to the First Embodiment in order of steps. This embodiment exemplifies a case where a structure equivalent to that of FIG. 5B is fabricated from a condition in which a selection transistor 3 has already been fabricated on a silicon substrate 21 (the illustration of the selection transistor 3 is omitted).

Figure 6A:
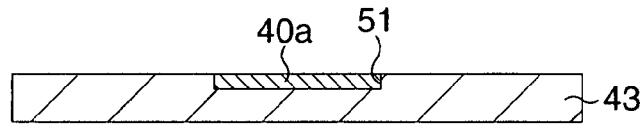
FIG. 6A is a schematic sectional view which shows a method of manufacturing an MRAM according to the First Embodiment in order of steps.

First, as shown in FIG. 6A, an interlayer dielectric film 43 is formed by depositing SiO₂ on a silicon substrate (not shown) by the CVD method, and a trench in the shape of an interconnect (an interconnect trench) 51 with a depth of 0.5 μm or so is formed in this interlayer dielectric film 43 by photolithography. As barrier metals, for example, a Ta film and a seed Cu film are caused to grow by the sputtering method in film thicknesses of, respectively, 30 nm or so and 100 nm or so, and Cu is then formed in a film thickness of 0.8 nm or so by the plating method, whereby the interconnect trench 51 is completely buried. After that, the Cu on the surface is removed by the chemical mechanical polishing (CMP) method, whereby a bottom portion 40a is formed within the interconnect trench 51.

Figure 6B:
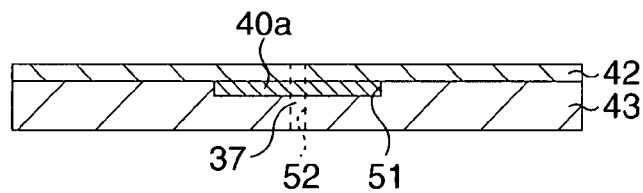
FIG. 6B is a schematic sectional view which shows a method of manufacturing an MRAM according to the First Embodiment in order of steps.

Subsequently, as shown in FIG. 6B, SiO₂ is deposited by the CVD method in a film thickness of 0.1 or so on the interlayer dielectric film 43 so as to cover the bottom portion 40a, whereby an interlayer dielectric film 42 is formed. After that, a connection hole 52 indicated by broken lines in the figure is formed in the interlayer dielectric films 42, 43 so that part of the surface of a drain diffusion layer 25 of the selection transistor 3 is exposed, the interior of this connection hole 52 is buried with tungsten (W) by the CVD method and the surface is planarized by CMP, whereby a W plug 37 indicated by broken lines in the figure is formed.

Figure 6C:
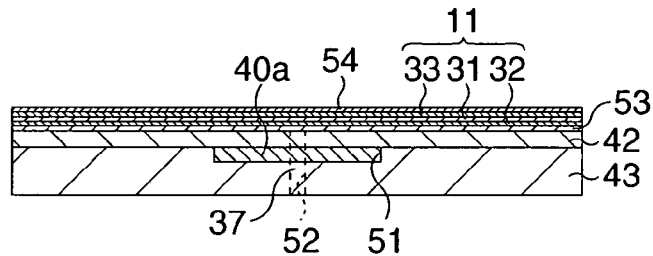
FIG. 6C is a schematic sectional view which shows a method of manufacturing an MRAM according to the First Embodiment in order of steps.

Subsequently, as shown in FIG. 6C, after the formation of a conductive film 53, which later becomes a lower-layer interconnect, on the interlayer dielectric film 42, for example, by the sputtering method, there are continuously formed Ta (40 nm)/PtMn (15 nm)/CoFe (2 nm)/Ru (0.9 nm)/CoFe (3 nm)/AlOx (1.2 nm)/NiFe (6 nm)/Ta (30 nm) and a cap film 54 of SiN or the like by the sputtering method. For AlOx, oxidation is controlled with an oxygen radical, for example.

Figure 6D:
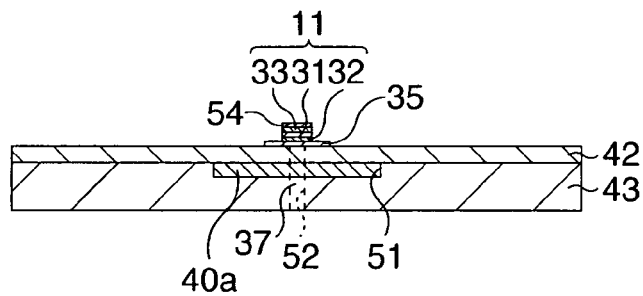
FIG. 6D is a schematic sectional view which shows a method of manufacturing an MRAM according to the First Embodiment in order of steps.

Subsequently, as shown in FIG. 6D, a ferromagnetic material layer 32, an insulating layer 31, a ferromagnetic material layer 33 and the cap film 54 are patterned by photolithography, whereby a TMR element 11 constituted by the ferromagnetic material layer 32, the insulating layer 31, and the ferromagnetic material layer 33 is formed. Upon this TMR element 11, the cap film 54 is similarly patterned. After that, the TMR element 11 is connected to the W plug 37 and the conductive film 53 is patterned by photolithography in the shape of an interconnect which performs isolation of the elements, whereby a lower interconnect 35 is formed.

Figure 6E:
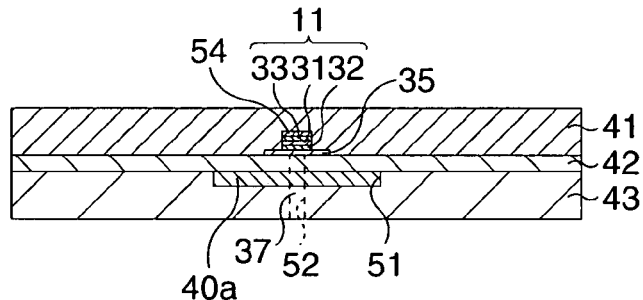
FIG. 6E is a schematic sectional view which shows a method of manufacturing an MRAM according to the First Embodiment in order of steps.

Subsequently, as shown in FIG. 6E, by using the CVD method SiO₂ is deposited thick (in a thickness of 0.1 μm or so) so as to cover the TMR element 11, whereby an interlayer dielectric film 41 is formed.

Figure 7A:
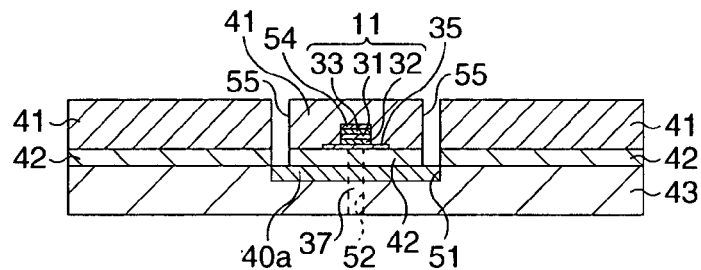
FIG. 7A is a schematic sectional view which shows a method of manufacturing an MRAM according to the First Embodiment in order of steps.

Subsequently, as shown in FIG. 7A, connection holes 55 which expose both ends of the bottom portion 40a are formed in the interlayer dielectric films 41, 42, respectively.

Figure 7B:
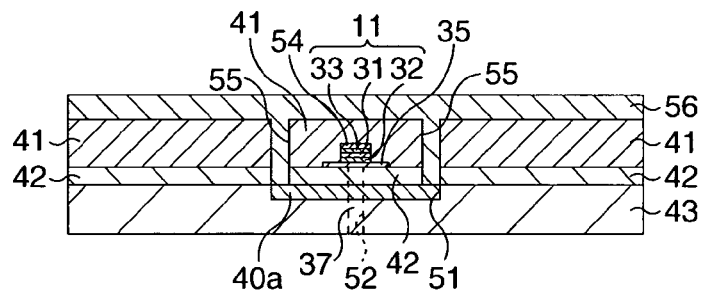
FIG. 7B is a schematic sectional view which shows a method of manufacturing an MRAM according to the First Embodiment in order of steps.

Subsequently, as shown in FIG. 7B, by using the CVD method a W film 56 is deposited on the interlayer dielectric film 41 so that the interior of each of the connection holes 55 is buried with tungsten (W).

Figure 7C:
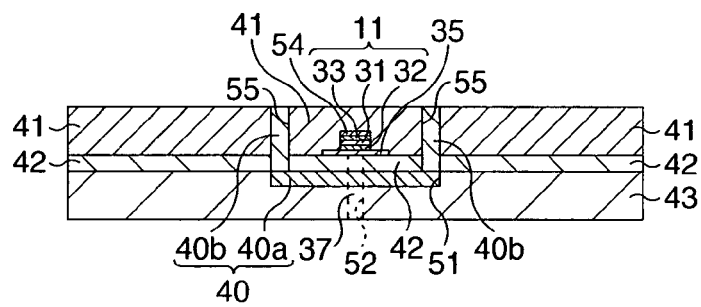
FIG. 7C is a schematic sectional view which shows a method of manufacturing an MRAM according to the First Embodiment in order of steps.

Subsequently, as shown in FIG. 7C, the surface of the W film 56 is planarized by using the interlayer dielectric film 41 as a stopper so that only the connection hole 55 is filled with W, whereby a W plug 40b is formed. At this time, there is formed a roughly U-shaped curved region 40, which is constituted by the bottom portion 40a and the W plug 40b connected to both ends thereof.

Figure 7D:
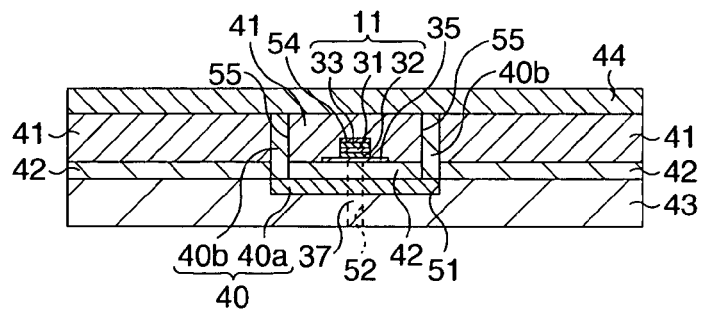
FIG. 7D is a schematic sectional view which shows a method of manufacturing an MRAM according to the First Embodiment in order of steps.

Subsequently, as shown in FIG. 7D, by using the CVD method SiO₂ is deposited in a film thickness of 0.3 μm or so in such a manner as to cover a top end of the W plug 40b, whereby an interlayer dielectric film 44 is formed.

Figure 7E:
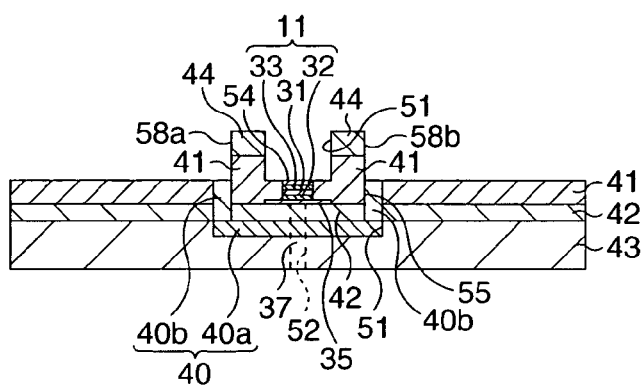
FIG. 7E is a schematic sectional view which shows a method of manufacturing an MRAM according to the First Embodiment in order of steps.

Subsequently, as shown in FIG. 7E, interconnect trenches 57, 58a, 58b whose longitudinal directions are orthogonal to each other are formed by photolithography with a depth of 0.4 nm or so in the interlayer dielectric films 44, 41 (in the upper layer thereof). Because the interconnect trench 57 is a trench for forming the bit line and is formed with a depth of 0.4 nm or so, the cap film 53 formed on the top surface of the TMR element 11 is removed by etching and the surface of the ferromagnetic material layer 33 of the TMR element 11 is exposed to the bottom surface of the interconnect trench 57. Because the interconnect trenches 58a, 58b are trenches for forming the linear region 45 of the word line except the curved region 40 of the word line and are formed with a depth of 0.4 nm or so, the top surface of the W plug 40b is positively exposed to the bottom surface of the interconnect trench 57.

Figure 8A:
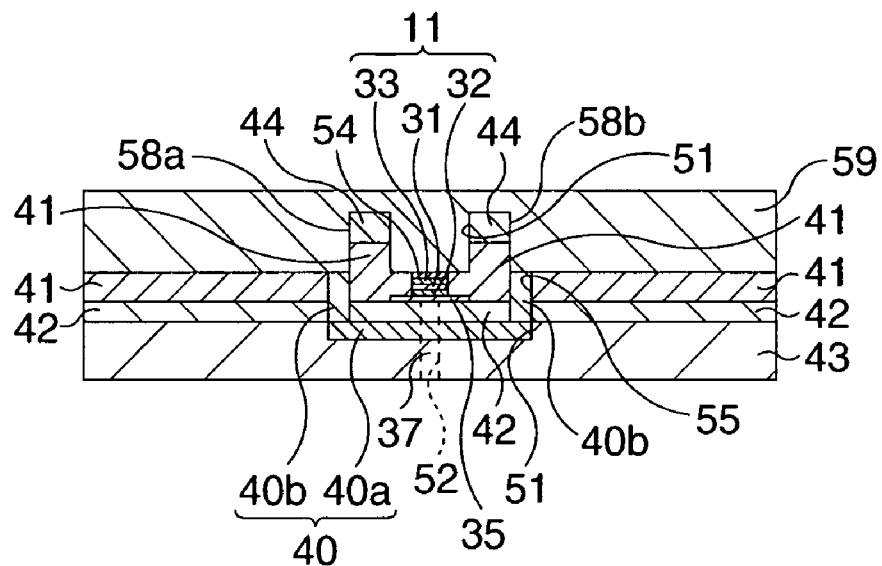
FIG. 8A is a schematic sectional view which shows a method of manufacturing an MRAM according to the First Embodiment in order of steps.

Subsequently, as shown in FIG. 8A, as a barrier metal, for example, a Ta film (not shown) and a seed Cu film (not shown) are caused to grow by the sputtering method in film thicknesses of, respectively, 30 nm or so and 100 nm or so, and a Cu film 59 is formed in a film thickness of 0.8 nm or so by the plating method, whereby the interconnect trenches 57, 58a, 58b are completely buried.

Figure 8B:
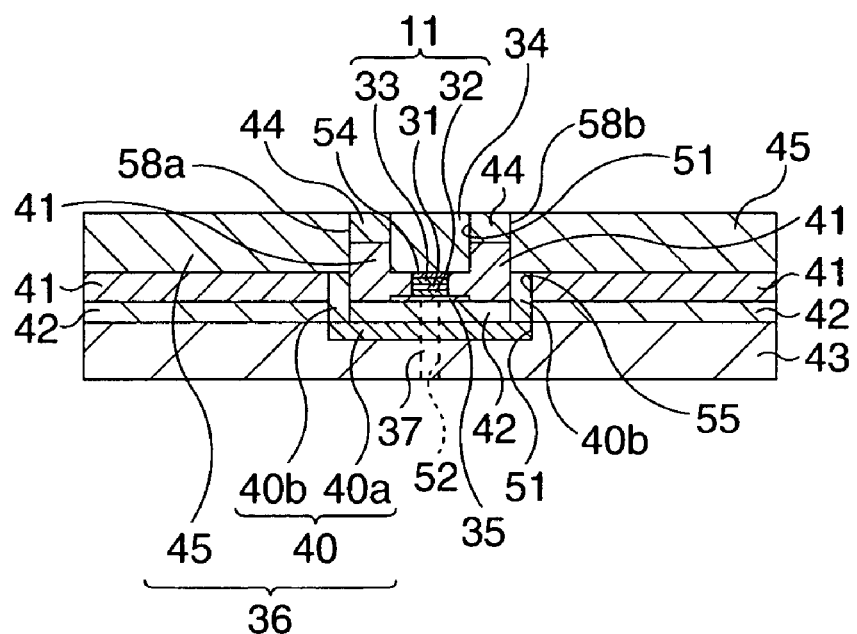
FIG. 8B is a schematic sectional view which shows a method of manufacturing an MRAM according to the First Embodiment in order of steps.

Subsequently, as shown in FIG. 8B, until the surface layer of the interlayer dielectric film 44 is removed, the Cu film 59 on the surface is removed by polishing by CMP to perform planarization, whereby there are formed a bit line 34 which is obtained by filling the interconnect line 57 with Cu and each linear region 45 which is obtained by filling the interconnect lines 58a, 58b with Cu. At this time, the linear curved region 45 and the curved region 40 are connected and integrated, whereby a word line 36 is formed.

After that, an MRAM is completed after the formation of a protective film and the like, which are not shown.

As described above, in the MRAM of this embodiment, the word line 36 has the local curved region 40 spaced from the TRM element 11 so as to surround the TRM element 11, and thanks to this construction it is possible to cause the magnetic fields to be concentrated on the TRM element 11. Therefore, it is possible to realize substantial power savings during data writing into the memory cell 1 while meeting requirements for further miniaturization of the MRAM.

(Modification)

A modification of the First Embodiment will be described here. This modification exemplifies an MRAM in which a U-shaped curved region is formed only in a word line and a magnetic-film-clad layer is formed in the word line and a bit line.

Figure 9A:
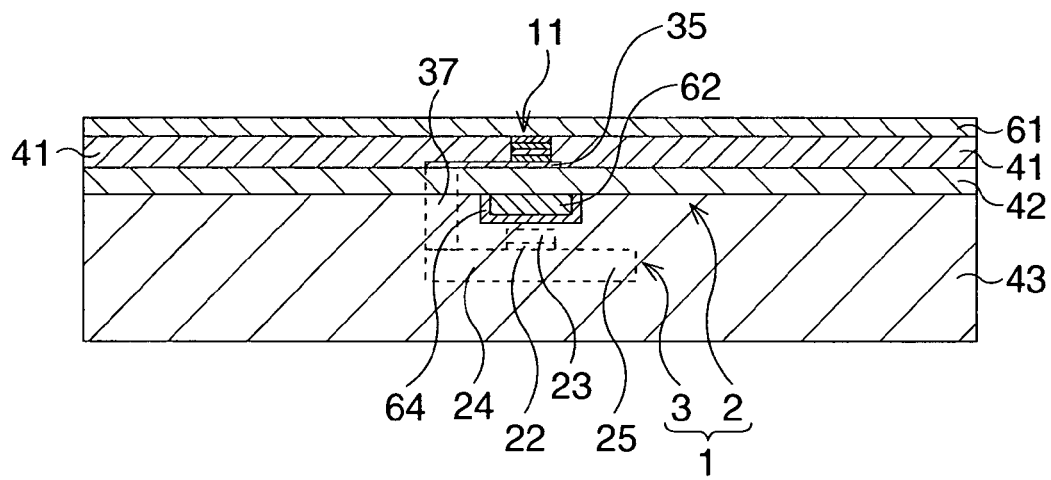
FIG. 9A is a sectional view which shows the general construction of a modification of an MRAM according to the First Embodiment.
Figure 9B:
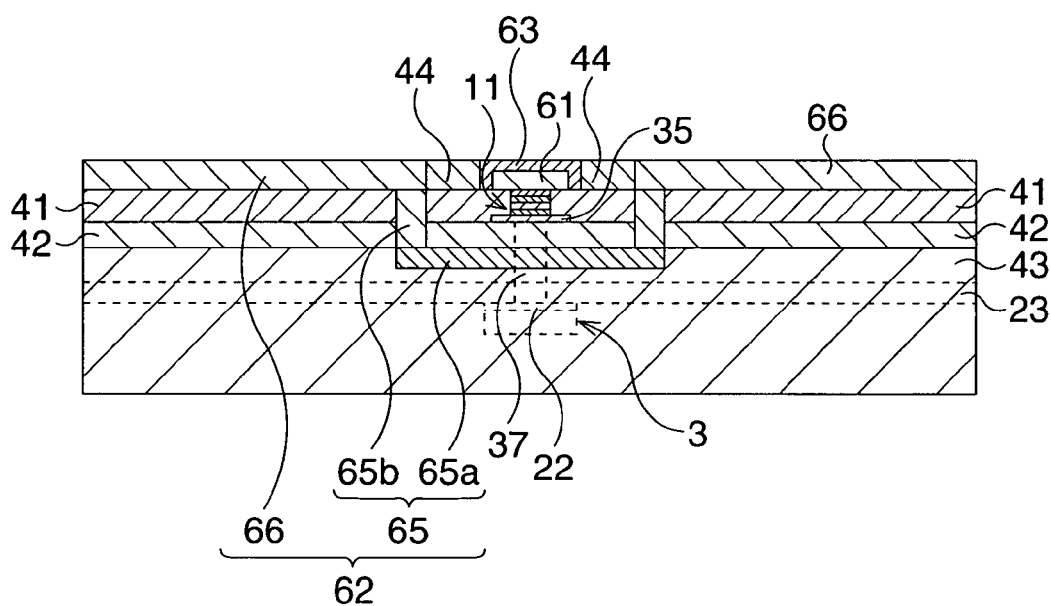
FIG. 9B is a sectional view which shows the general construction of a modification of an MRAM according to the First Embodiment.

FIGS. 9A and 9B are sectional views which show the general construction of an MRAM in this modification. FIG. 9A corresponds to a section taken along the line I-I' of FIG. 4 in FIG. 5A, and FIG. 9B corresponds to a section taken along the line II-II' of FIG. 4 in FIG. 5B.

In this MARM, a plurality of memory cells 1 are disposed, for example, in a matrix manner to form a memory cell array. Each of the memory cells 1 has a memory part 2 provided with a TMR element 11 comprising an MTJ and a selection transistor 11 for selecting a relevant memory cell 1 from the plurality of memory cells 1.

The selection transistor 3 is a pMOS transistor which conforms to a 0.18 μm rule, for example, and is provided with, for example, a gate electrode 23 which is patterned in a strip manner on a silicon substrate 21 via a gate insulating film 22, and a source diffusion layer 24 and a drain diffusion layer 25, which are obtained by introducing a p type impurity into surface layers of silicon thin films 21 on both sides of this gate electrode 23.

The memory portion 2 is provided with the TMR element 11 having ferromagnetic material layers 32, 33, which support a thin insulating layer 32 by sandwiching the thin insulating layer 31, and is buried in an interlayer dielectric film 41, a bit line 61 which is connected to the ferromagnetic material layer 33 of the TMR element 11 and extends linearly on the interlayer dielectric film 41, a lower interconnect 35 which is patterned on an interlayer dielectric film 42 and connected to the ferromagnetic material layer 32 of the TMR element 11, a word line 62 which extends so as to be orthogonal to the bit line 61, and a W plug 37 which is connected to the lower interconnect 35. A bottom end of the W plug 37 and the drain diffusion layer 25 of the selection transistor 3 are connected, and a top end of the W plug 37 and the lower interconnect 35 are connected, respectively. That is, the drain diffusion layer 25 of the selection transistor 3 and the TMR element 11 are connected via the W plug 37 and the lower interconnect 35.

The TMR element 11 is composed, in order from the lower layer, of Ta (40 nm)/PtMn (15 nm)/CoFe (2 nm)/Ru (0.9 nm)/CoFe (3 nm)/AlOx (1.2 nm)/NiFe (6 nm)/Ta (30 nm), for example. Ta is an electrode layer, PtMn is an antiferromagnetic material layer, COFe and NiFe are ferromagnetic material layers, and AlOx is an insulating layer. Therefore, in the illustrated example, the construction is as follows: an electrode layer (not shown)/an antiferromagnetic material layer (not shown), the ferromagnetic material layer 32/the insulating layer 31/the ferromagnetic material layer 33/an electrode layer (not shown).

The bit line 61 is constructed in such a manner that a surface thereof is coated with a high-permeability material, for example, a magnetic-film-clad layer 63 made of, for example, NiFe, in a film thickness of 50 nm or so. This magnetic-film-clad layer 63 has the function of confining magnetic fluxes generated from the bit line 61 and causing the magnetic fluxes to be concentrated. It is possible to adopt such a construction that the bit line 61 is divided into two upper and lower parts, which are used separately for writing and for an upper electrode.

In the word line 62, a local curved region 65 spaced from the TMR element 11 is formed so as to surround the TMR element 11. This curved region 65 is in bent shape, with the TMR element 11 serving as a center, in this case, in rough U shape. The curved region 65 is constituted, in rough U shape, by a bottom portion 65a which is patterned above the gate electrode 23 within an interlayer dielectric film 43 and a W plug 65b which is formed in the interlayer dielectric films 41, 42 on this bottom portion 65a so as to be connected to both ends of the bottom portion 65a. The narrower the gap between the lower interconnect 35 and the curved region 65 of the word line 62, in other words, the smaller the thickness of the interlayer dielectric film 42, the larger the strength of magnetic fields applied to the TMR element 11. In consideration of this fact together with ensuring insulating properties, it is suitable that the thickness of the interlayer dielectric film 42 be 100 nm or so.

The word line 62 is constructed in such a manner that a surface of the bottom surface 65a of the curved region 65 is coated with a high-permeability material, for example, a magnetic-film-clad layer 64 made of, for example, NiFe, in a film thickness of 50 nm or so. This magnetic-film-clad layer 64 has the function of confining magnetic fluxes generated from the word line 62 and causing the magnetic fluxes to be concentrated.

A linear region 66 of the word line 62 other than the curved region 65 is an area which is connected to each of the W plugs 65b on the interlayer dielectric film 41 and extends linearly, and is disposed so as to be orthogonal to the bit line 61 on the interlayer dielectric film 41 in the same hierarchical position with the bit line 61 (on the same plane therewith). That is, the linear region 66 of the word line 62 and the bit line 61 are buried together in an interlayer dielectric film 44 on the same plane. Thanks to this interconnect construction, the number of layers of the memory part 2 decreases, permitting further miniaturization of the memory cell 1, with the result that high-density layouts of the memory cell array and an increase in the strength of composite magnetic fields are realized.

The sizes of the bit line 61, word line 62 and W plugs 37, 65b may be larger than 0.18 μm depending on the integration level of the memory cell. For example, the bit line 61 and the word line 62 may be formed with a width of 0.35 μm or so.

As described above, in the MRAM of this modification, the word line 62 has the local curved region 65 spaced from the TRM element 11 so as to surround the TRM element 11, and besides the magnetic-film-clad layers 63, 64 are formed so as to cover the bit line 61 and the bottom portion 65a of the curved region 65 of the word line 62. Thanks to this construction it is possible to ensure that magnetic fields are more efficiently concentrated on the TRM element 11. Therefore, it is possible to realize substantial power savings during data writing into the memory cell 1 while meeting requirements for further miniaturization of the MRAM.

Second Embodiment

This embodiment exemplifies an MRAM in which a U-shaped curved region is formed only in a bit line and is not formed in a word line.

(Construction of MRAM)

Figure 10A:
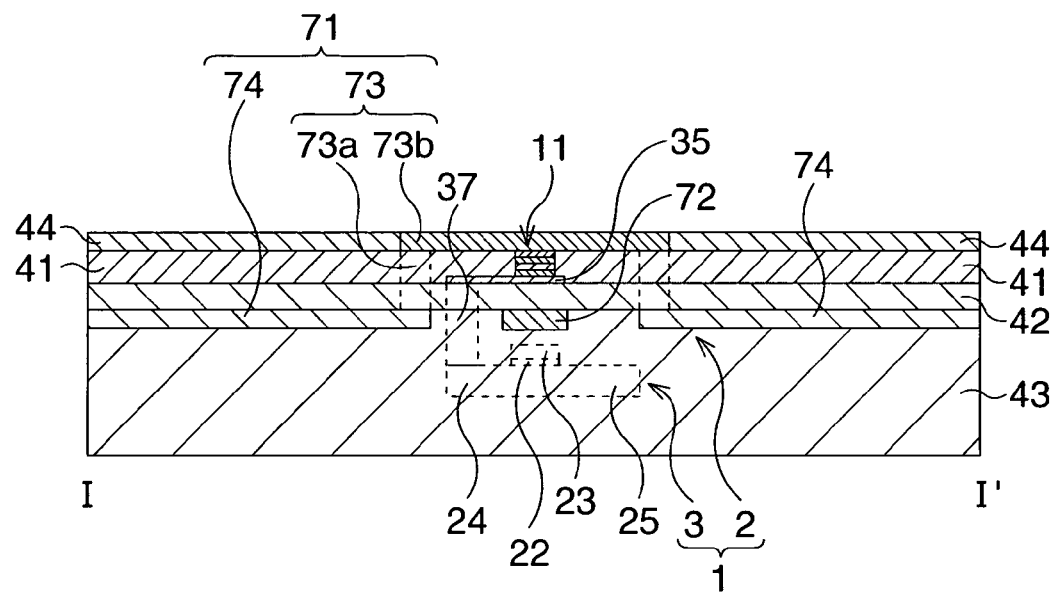
FIG. 10A is a sectional view which shows the general construction of an MRAM according to the Second Embodiment.
Figure 10B:
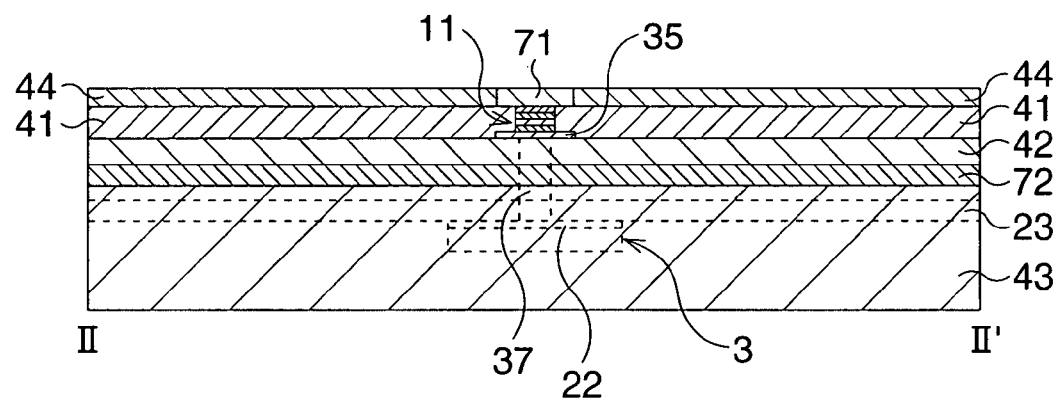
FIG. 10B is a sectional view which shows the general construction of an MRAM according to the Second Embodiment.

FIGS. 10A and 10B are sectional views which show the general construction of an MRAM according to the Second Embodiment, FIG. 10A corresponds to a section taken along the line I-I' of FIG. 4 in FIG. 5A, and FIG. 10B corresponds to a section taken along the line II-II' of FIG. 4 in FIG. 5B.

In this MARM, a plurality of memory cells 1 are disposed, for example, in a matrix manner to form a memory cell array. Each of the memory cells 1 has a memory part 2 provided with a TMR element 11 comprising an MTJ and a selection transistor 11 for selecting a relevant memory cell 1 from the plurality of memory cells 1.

The selection transistor 3 is a pMOS transistor which conforms to a 0.18 μm rule, for example, and is provided with, for example, a gate electrode 23 which is patterned in a strip manner on a silicon substrate 21 via a gate insulating film 22, and a source diffusion layer 24 and a drain diffusion layer 25, which are obtained by introducing a p type impurity into surface layers of silicon thin films 21 on both sides of this gate electrode 23.

The memory portion 2 is provided with the TMR element 11 which has ferromagnetic material layers 32, 33, which support a thin insulating layer 31 by sandwiching the thin insulating layer 31, and is buried in an interlayer dielectric film 41, a bit line 71 which is connected to the ferromagnetic material layer 33 of the TMR element 11, a lower interconnect 35 which is patterned on an interlayer dielectric film 42 and connected to the ferromagnetic material layer 32 of the TMR element 11, a word line 72 which extends linearly within an interlayer dielectric film 43 so as to be orthogonal to the bit line 71, and a W plug 37 which is connected to the lower interconnect 35. A bottom end of the W plug 37 and the drain diffusion layer 25 of the selection transistor 3 are connected, and a top end of the W plug 37 and the lower interconnect 35 are connected, respectively. That is, the drain diffusion layer 25 of the selection transistor 3 and the TMR element 11 are connected via the W plug 37 and the lower interconnect 35.

The TMR element 11 is composed, in order from the lower layer, of Ta (40 nm)/PtMn (15 nm)/CoFe (2 nm)/Ru (0.9 nm)/CoFe (3 nm)/AlOx (1.2 nm)/NiFe (6 nm)/Ta (30 nm), for example. Ta is an electrode layer, PtMn is an antiferromagnetic material layer, COFe and NiFe are ferromagnetic material layers, and AlOx is an insulating layer. Therefore, in the illustrated example, the construction is as follows: an electrode layer (not shown)/an antiferromagnetic material layer (not shown), a ferromagnetic material layer (not shown), the ferromagnetic material layer 32/the insulating layer 31/the ferromagnetic material layer 33/an electrode layer (not shown).

In the bit line 71, a local curved region 73 surrounding the TMR element 11 is formed. This curved region 73 is in bent shape, with the TMR element 11 serving as a center, in this case, in rough U shape (roughly inverted U shape). The curved region 73 is constituted, in roughly inverted U shape, by a top portion 73a which is patterned to as to be connected to a top surface of the TMR element 11 within an interlayer dielectric film 44 and a W plug 73b which is formed in the interlayer dielectric films 41, 42 below this top portion 73a so as to be connected to both ends of the top portion 73a. The narrower the gap between the lower interconnect 35 and the word line 72, in other words, the smaller the thickness of the interlayer dielectric film 42, the larger the strength of magnetic fields applied to the TMR element 11. In consideration of this fact together with ensuring insulating properties, it is preferred that the thickness of the interlayer dielectric film 42 be 100 nm or so.

And a linear region 74 of the bit line 71 other than the curved region 73 is an area which is connected to each of the W plugs 73b within the interlayer dielectric film 43 and extends linearly, and is disposed so as to be orthogonal to the word line 72 within the interlayer dielectric film 43 in the same hierarchical position with the word line 71 (flush therewith). Thanks to this interconnect construction, the number of layers of the memory part 2 decreases, permitting further miniaturization of the memory cell 1, with the result that high-density layouts of the memory cell array and an increase in the strength of composite magnetic fields are realized.

The sizes of the bit line 71, word line 72 and W plugs 37, 73b may be larger than 0.18 μm depending on the integration level of the memory cell. For example, the bit line 71 and the word line 72 may be formed with a width of 0.35 μm or so.

(Method of Manufacturing MRAM)

FIGS. 11A to 11E, FIGS. 12A to 12E, and FIGS. 13A and 13B are schematic sectional views which show a method of manufacturing an MRAM in this embodiment in order of steps. This embodiment exemplifies a case where an MRAM is fabricated from a condition in which a selection transistor 3 has already been fabricated on a silicon substrate 21 (the illustration of the selection transistor 3 is omitted).

Figure 11A:
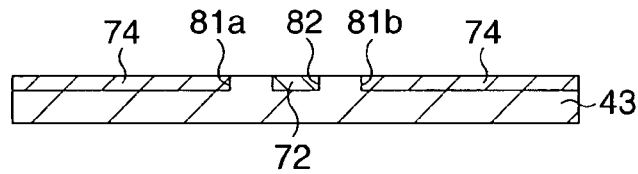
FIG. 11A is a schematic sectional view which shows a method of manufacturing an MRAM according to the Second Embodiment in order of steps.

First, as shown in FIG. 11A, an interlayer dielectric film 43 is formed by depositing SiO₂ on the silicon substrate 21 by the CVD method, and interconnect trenches 81a, 81b and an interconnect trench 82 with a depth of 0.5 μm or so are formed in this interlayer dielectric film 43 by photolithography. The interconnect trenches 81a, 81b are trenches for forming a linear region 74, which is a portion of a bit line 71 other than a curved region 73, and the interconnect trench 82 is a trench for forming a word line 72. The longitudinal direction of the interconnect trenches 81a, 81b and the longitudinal direction of the interconnect trench 82 are orthogonal to each other.

As barrier metals, for example, a Ta film and a seed Cu film are caused to grow by the sputtering method in film thicknesses of, respectively, 30 nm or so and 100 nm or so, and Cu is formed in a film thickness of 0.8 nm or so by the plating method, whereby the interconnect trenches 81a, 81b, 82 are completely buried. After that, the Cu on the surface is polished and removed by CMP to perform planarization, whereby there are formed the linear region 74 of the bit line 71, which is obtained by filling the interconnect trenches 81a, 81b with Cu, and the word line 72, which is obtained by filling the interconnect trench 82 with Cu.

Figure 11B:
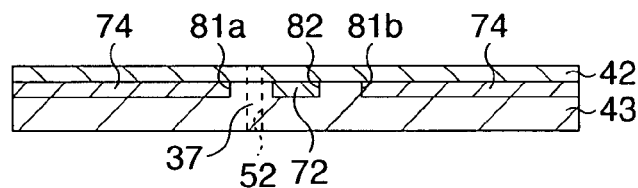
FIG. 11B is a schematic sectional view which shows a method of manufacturing an MRAM according to the Second Embodiment in order of steps.

Subsequently, as shown in FIG. 11B, $SiO_2$ is deposited by the CVD method in a film thickness of 0.1 or so on the interlayer dielectric film 43 so as to cover the word line 72 and the linear region 74, whereby an interlayer dielectric film 42 is formed. After that, a connection hole 52 indicated by broken lines in the figure is formed in the interlayer dielectric films 42, 43 so that part of the surface of a drain diffusion layer 25 of a selection transistor 3 is exposed, the interior of this connection hole 52 is buried with tungsten (W) by the CVD method and the surface is planarized by CMP, whereby a W plug 37 indicated by broken lines in the figure is formed.

Figure 11C:
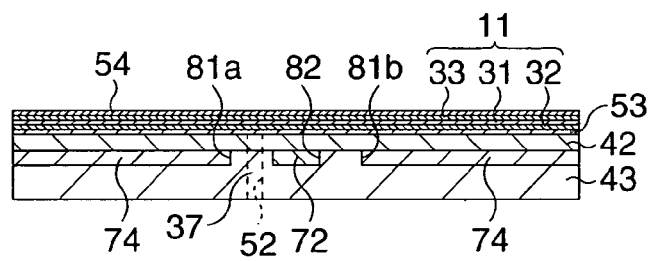
FIG. 11C is a schematic sectional view which shows a method of manufacturing an MRAM according to the Second Embodiment in order of steps.

Subsequently, as shown in FIG. 11C, after the formation of a conductive film 53, which later becomes a lower-layer interconnect, on the interlayer dielectric film 42, for example, by the sputtering method, there are continuously formed Ta/PtMn/CoFe/Ru/CoFe/AlOx/NiFe/Ta and a cap film 54 of SiN or the like by the sputtering method. For AlOx, oxidation is controlled with an oxygen radical, for example.

Figure 11D:
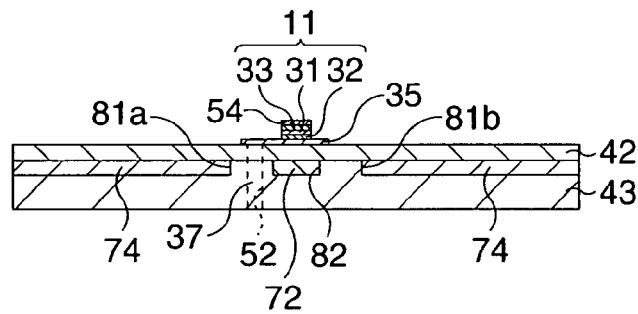
FIG. 11D is a schematic sectional view which shows a method of manufacturing an MRAM according to the Second Embodiment in order of steps.

Subsequently, as shown in FIG. 11D, Ta/PtMn/CoFe/Ru/CoFe/AlOx/NiFe/Ta and the cap film 54 are patterned by photolithography, whereby a TMR element 11 constituted by a ferromagnetic material layer 32, an insulating layer 31 and a ferromagnetic material layer 33 is formed. Upon this TMR element 11, the cap film 54 is similarly patterned. After that, the TMR element 11 is connected to the W plug 37 and the conductive film 53 is patterned by photolithography in the form of an interconnect which performs isolation of the elements, whereby a lower interconnect 35 is formed.

Figure 11E:
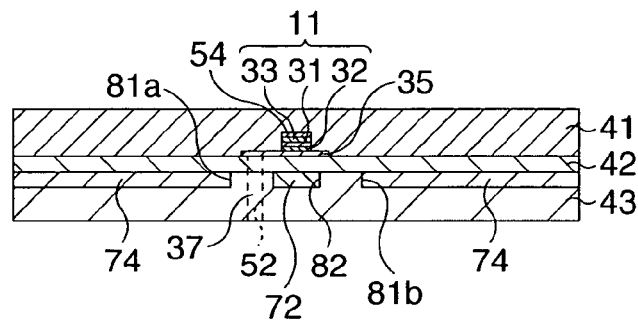
FIG. 11E is a schematic sectional view which shows a method of manufacturing an MRAM according to the Second Embodiment in order of steps.

Subsequently, as shown in FIG. 11E, by using the CVD method $SiO_2$ is deposited thick (in a thickness of 0.1 μm or so) so as to cover the TMR element 11, whereby an interlayer dielectric film 41 is formed.

Figure 12A:
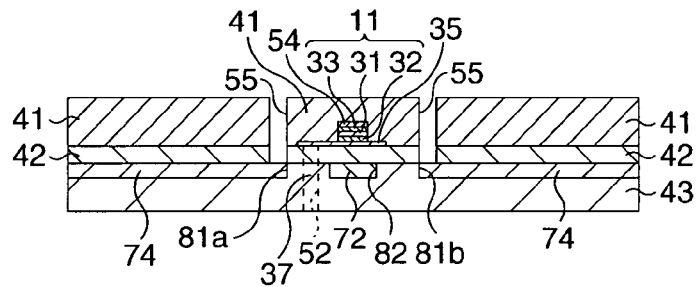
FIG. 12A is a schematic sectional view which shows a method of manufacturing an MRAM according to the Second Embodiment in order of steps.

Subsequently, as shown in FIG. 12A, connection holes 55 which expose one end of each of the linear regions are formed in the interlayer dielectric films 41, 42.

Figure 12B:
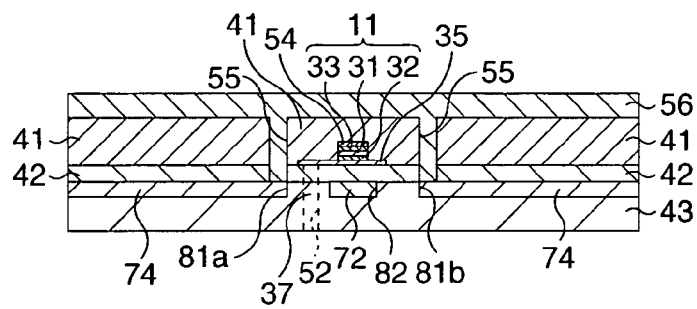
FIG. 12B is a schematic sectional view which shows a method of manufacturing an MRAM according to the Second Embodiment in order of steps.

Subsequently, as shown in FIG. 12B, by using the CVD method a W film 56 is deposited on the interlayer dielectric film 41 so that the interior of each of the connection holes 55 is buried with tungsten (W).

Figure 12C:
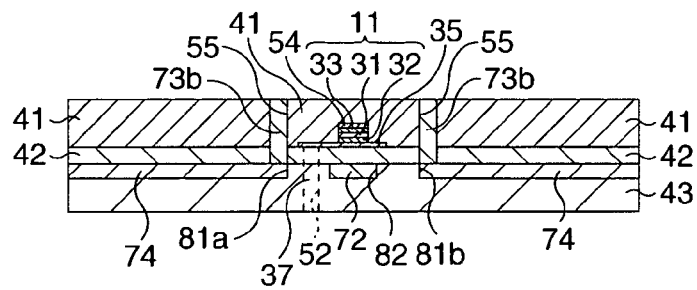
FIG. 12C is a schematic sectional view which shows a method of manufacturing an MRAM according to the Second Embodiment in order of steps.

Subsequently, as shown in FIG. 12C, the surface of the W film 56 is planarized by using the interlayer dielectric film 41 as a stopper so that only the connection hole 55 is filled with W, whereby a W plug 73b is formed.

Figure 12D:
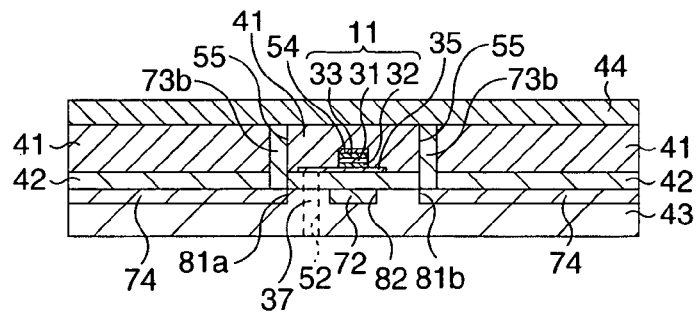
FIG. 12D is a schematic sectional view which shows a method of manufacturing an MRAM according to the Second Embodiment in order of steps.

Subsequently, as shown in FIG. 12D, by using the CVD method $SiO_2$ is deposited in a film thickness of 0.3 μm or so in such a manner as to cover a top end of the W plug 73b, whereby an interlayer dielectric film 44 is formed.

Figure 12E:
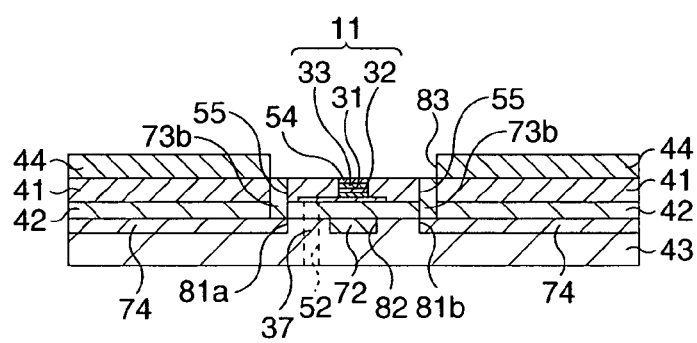
FIG. 12E is a schematic sectional view which shows a method of manufacturing an MRAM according to the Second Embodiment in order of steps.

Subsequently, as shown in FIG. 12E, an interconnect trench 83 with a depth of 0.4 nm or so is formed by photolithography in the interlayer dielectric films 44, 41 (in the upper layer thereof) so that the top surface of the W plug 37b and the top surface of the TMR element 11 are exposed. Because this interconnect trench 83 is a trench for forming the linear region 74 which is a portion of the bit line 71 except the curved region 73 and is formed with a depth of 0.4 nm or so, the top surface of the W plug 73b and the top surface of the TMR element 11 are positively exposed to the bottom surface of the interconnect trench 83.

Figure 13A:
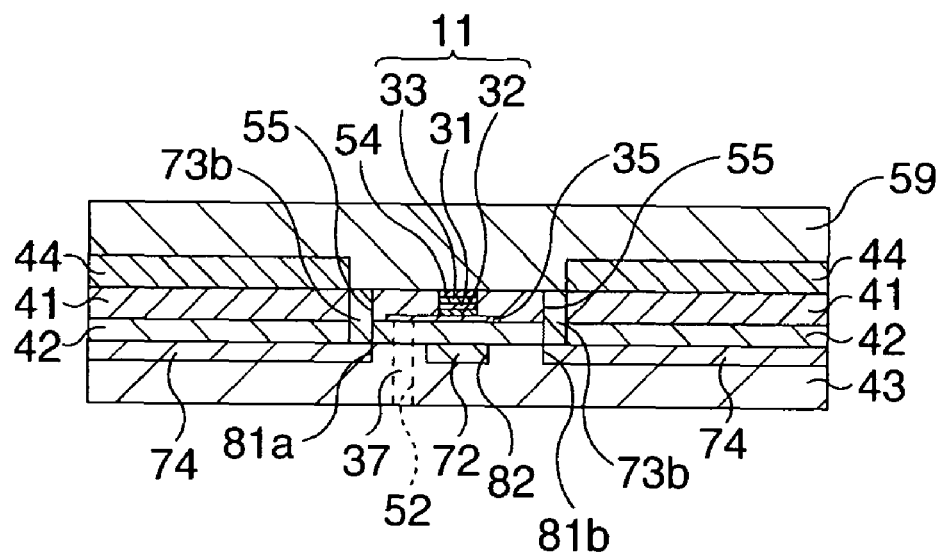
FIG. 13A is a schematic sectional view which shows a method of manufacturing an MRAM according to the Second Embodiment in order of steps.

Subsequently, as shown in FIG. 13A, as a barrier metal, for example, a Ta film (not shown) and a seed Cu film (not shown) are caused to grow by the sputtering method in film thicknesses of, respectively, 30 nm or so and 100 nm or so, and a Cu film 59 is formed in a film thickness of 0.8 nm or so by the plating method, whereby the interconnect trench 84 is completely buried.

Figure 13B:
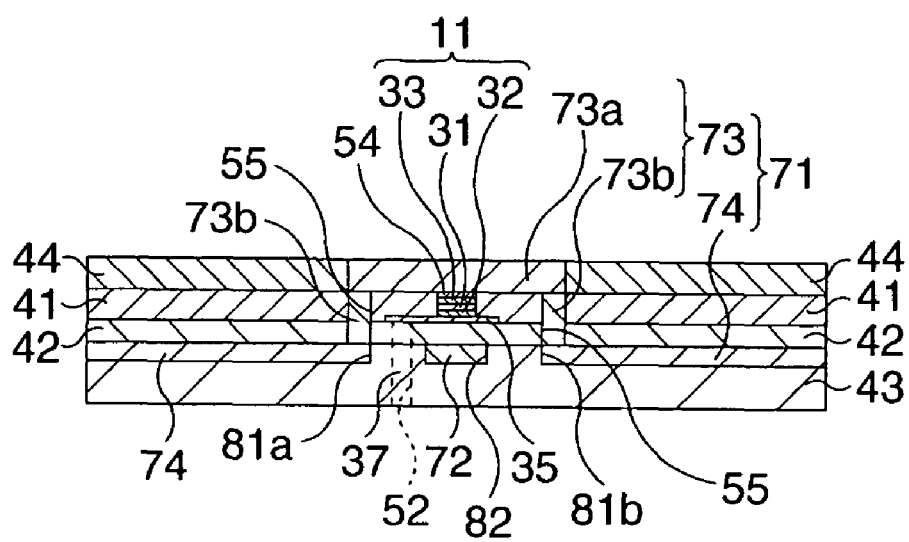
FIG. 13B is a schematic sectional view which shows a method of manufacturing an MRAM according to the Second Embodiment in order of steps.

Subsequently, as shown in FIG. 13B, until the surface layer of the interlayer dielectric film 44 is removed, the surface Cu film 59 is removed by polishing by CMP to perform planarization, whereby the interconnect trench 84 is filled with Cu and an upper portion 73b which, along with the W plug 73b, constitutes the roughly inverted U-shaped curved region 73 is formed. At this time, the linear curved region 74 and the curved region 73 are connected and integrated, whereby a bit line 71 is formed.

After that, an MRAM is completed through the formation of a protective film and the like, which are not shown.

As described above, in the MRAM of this embodiment, the bit line 71 has the local curved region 73 spaced from the TRM element 11 so as to surround the TRM element 11, and thanks to this construction it is possible to cause the magnetic fields to be concentrated on the TRM element 11. Therefore, it is possible to realize substantial power savings during data writing into the memory cell 1 while meeting requirements for further miniaturization of the MRAM.

Third Embodiment

This embodiment exemplifies an MRAM in which a U-shaped curved region is formed in both of a word line and a bit line.

(Construction of MRAM)

Figure 14:
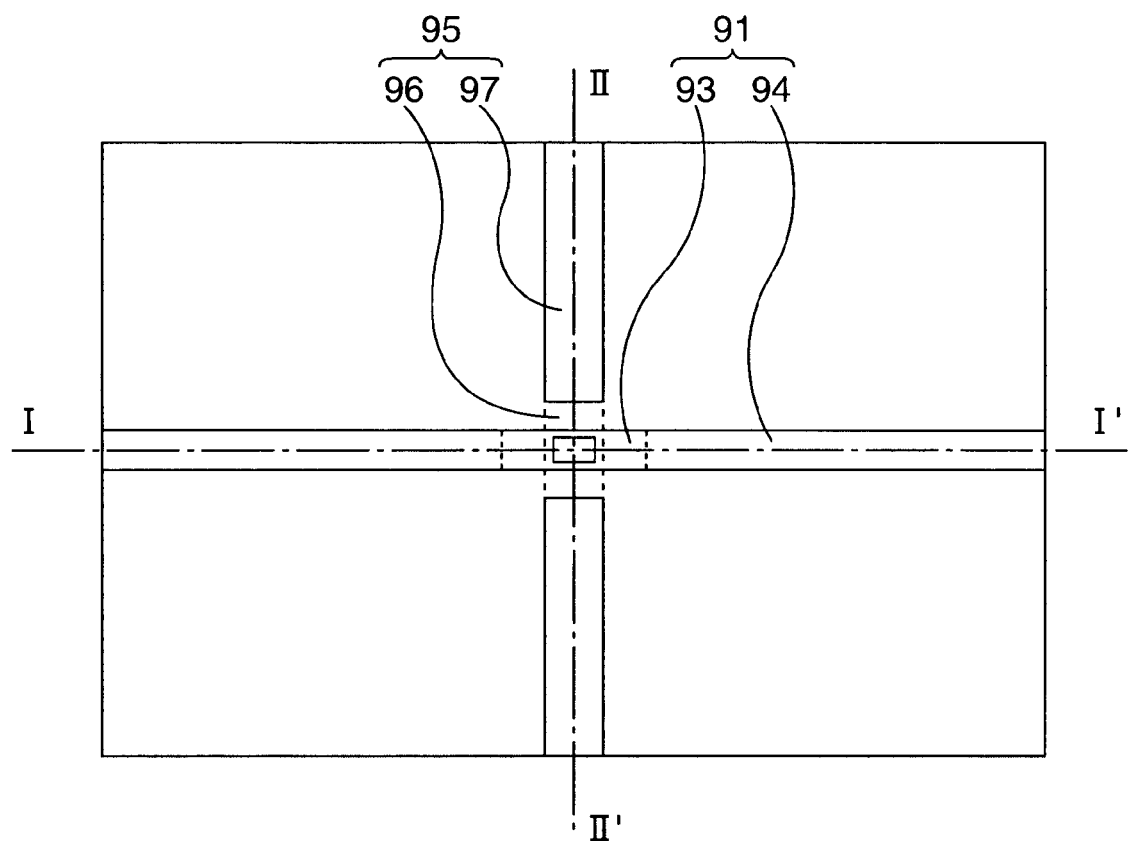
FIG. 14 is a plan view which shows the general construction of an MRAM according to the Third Embodiment.
Figure 15A:
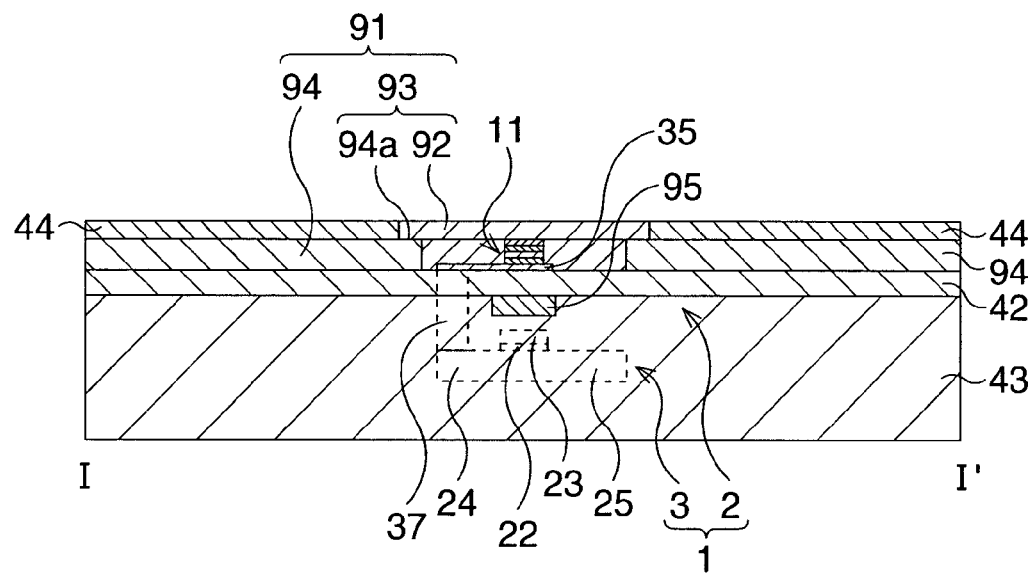
FIG. 15A is a schematic sectional view taken along the line I-I' of FIG. 14.
Figure 15B:
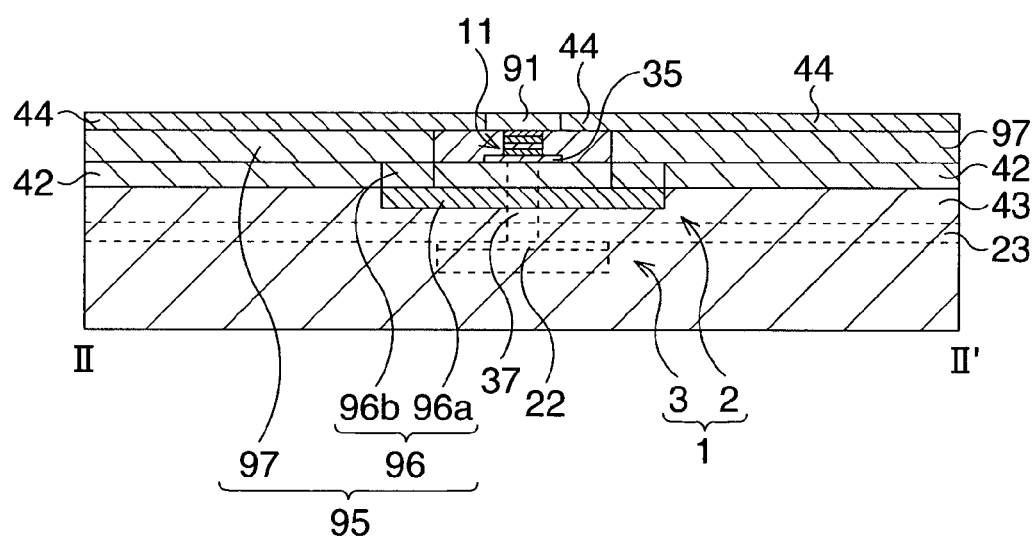
FIG. 15B is a schematic sectional view taken along the line II-II' of FIG. 14.

FIG. 14 is a plan view which shows the general construction of an MRAM according to the Third Embodiment, FIG. 15A is a sectional view taken along the line I-I' of FIG. 14, and FIG. 15B is a sectional view taken along the line II-II' of FIG. 14.

In this MARM, a plurality of memory cells 1 are disposed, for example, in a matrix manner to form a memory cell array. Each of the memory cells 1 has a memory part 2 provided with a TMR element 11 comprising an MTJ and a selection transistor 3 for selecting a relevant memory cell 1 from the plurality of memory cells 1.

The selection transistor 3 is a pMOS transistor which conforms to a 0.18 μm rule, for example, and is provided with, for example, a gate electrode 23 which is patterned in a strip manner on a silicon substrate 21 via a gate insulating film 22, and a source diffusion layer 24 and a drain diffusion layer 25, which are formed by introducing a p type impurity into surface layers of silicon thin films 21 on both sides of this gate electrode 23.

The memory portion 2 is provided with the TMR element 11 which has ferromagnetic material layers 32, 33, and supports a thin insulating layer 31 by sandwiching the thin insulating layer 31, and is buried in an interlayer dielectric film 41, a bit line 91 which is connected to the ferromagnetic material layer 33 of the TMR element 11, a lower interconnect 35 which is patterned on an interlayer dielectric film 42 and connected to the ferromagnetic material layer 32 of the TMR element 11, a word line 95 which extends so as to be orthogonal to the bit line 91, and a W plug 37 which is connected to the lower interconnect 35. A bottom end of the W plug 37 and the drain diffusion layer 25 of the selection transistor 3 are connected, and a top end of the W plug 37 and the lower interconnect 35 are connected. That is, the drain diffusion layer 25 of the selection transistor 3 and the TMR element 11 are connected via the W plug 37 and the lower interconnect 35.

The TMR element 11 is composed, in order from the lower layer, of Ta (40 nm)/PtMn (15 nm)/CoFe (2 nm)/Ru (0.9 nm)/CoFe (3 nm)/AlOx (1.2 nm)/NiFe (6 nm)/Ta (30 nm), for example. Ta is an electrode layer, PtMn is an antiferromagnetic material layer, COFe and NiFe are ferromagnetic material layers, and AlOx is an insulating layer. Therefore, in the illustrated example, the construction is as follows: an electrode layer (not shown)/an antiferromagnetic material layer (not shown), the ferromagnetic material layer 32/the insulating layer 31/the ferromagnetic material layer 33/an electrode layer (not shown).

In the bit line 91, a local curved region 93 surrounding the TMR element 11 is formed. This curved region 93 is in bent shape, with the TMR element 11 serving as a center, in this case, in rough U shape (roughly inverted U shape). That is, as shown in FIG. 15A, the bit line 91 is constituted by a top portion 92 which is patterned so as to be connected to a top surface of the TMR element 11 within an interlayer dielectric film 44 and a linear region 94 which extends linearly within an interlayer dielectric film 43 so as to be connected to each end of the top portion 92 below the top portion 92. The roughly inverted U-shaped curved region 93 is constituted by the top portion 92 and a connection area 94a of each of the linear regions 94 in both ends of the top portion 92.

In the word line 95, a local curved region 96 spaced from the TMR element 11 is formed in an area opposed to the curved region 93 of the bit line 91 so as to surround the TMR element 11. This curved region 96 is in bent shape, with the TMR element 11 serving as a center, in this case, in rough U shape. As shown in FIG. 15B, the curved region 96 is constituted by a bottom portion 96a which is patterned above the gate electrode 23 within the interlayer dielectric film 43 and a W plug 96b which is formed in an interlayer dielectric film 42 on this bottom portion 96a so as to be connected to both ends of the bottom portion 96a.

The narrower the gap between the lower interconnect 35 and the curved region 96 of the word line 95, in other words, the smaller the thickness of the interlayer dielectric film 42, the larger the strength of magnetic fields applied to the TMR element 11. In consideration of this fact and ensuring insulating properties, it is preferred that the thickness of the interlayer dielectric film 42 be 100 nm or so.

Each linear region 97 of the word line 95 other than the curved region 96 is an area which is connected to each of the W plugs 96b on the interlayer dielectric film 42 and extends linearly, and is disposed in the same hierarchical position with the TMR element 11 and each linear region 94 of the bit line 91 (flush therewith) on the interlayer dielectric film 42, and the linear region 97 and the linear region 94 are orthogonal to each other. That is, the TMR element 11, the linear region 97 of the word line 95 and each of the linear regions 94 of the bit line 91 are buried together in the interlayer dielectric film 41 on the same plane. Thanks to this interconnect construction, the number of layers of the memory part 2 decreases, permitting further miniaturization of the memory cell 1, with the result that high-density layouts of the memory cell array and an increase in the strength of composite magnetic fields are realized.

The sizes of the bit line 91, word line 95 and W plugs 37, 96b may be larger than 0.18 μm depending on the integration level of the memory cell. For example, the bit line 91 and the word line 95 may be formed with a width of 0.35 μm or so.

(Method of Manufacturing MRAM)

FIGS. 16A to 16G and FIGS. 17A to 17E are schematic sectional views which show a method of manufacturing an MRAM according to the Third Embodiment in order of steps. This embodiment exemplifies a case where a structure corresponding to FIGS. 15A and 15B is fabricated from a condition in which a selection transistor 3 has already been fabricated on a silicon substrate 21 (the illustration of the selection transistor 3 is omitted). In each of the figures, the left side corresponds to a section taken along the line I-I' of FIG. 14 in the same manner as in FIG. 15A, and the right side corresponds to a section taken along the line II-II' of FIG. 14 in the same manner as in FIG. 15B.

First, as shown in FIG. 16A, an interlayer dielectric film 43 is formed by depositing $SiO_2$ on the silicon substrate 21 by the CVD method, and a trench (an interconnect trench) 51 in the shape of an interconnect having with a depth of 0.5 μm or so is formed in this interlayer dielectric film 43 by photolithography. As barrier metals, for example, a Ta film and a seed Cu film are caused to grow by the sputtering method in film thicknesses of, respectively, 30 nm or so and 100 nm or so, and Cu is formed in a film thickness of 0.8 nm or so by the plating method, whereby the interconnect trench 51 is completely buried. After that, the Cu on the surface is removed by the chemical mechanical polishing (CMP) method, whereby a bottom portion 96a of a curved region 96 is formed within the interconnect trench 51.

Subsequently, as shown in FIG. 16B, $SiO_2$ is deposited by the CVD method on the interlayer dielectric film 43 in a film thickness of 0.1 μm or so as to cover a bottom portion 40a, whereby an interlayer dielectric film 42 is formed. After that, a connection hole 52 indicated by broken lines in the figure is formed in the interlayer dielectric films 42, 43 so that part of the surface of a drain diffusion layer 25 of the selection transistor 3 is exposed, and a connection hole 55 indicated by broken lines in the figure is formed so that both ends of the bottom portion 96a are exposed.

Subsequently, as shown in FIG. 16C, the interiors of the connection holes 52, 55 are buried with tungsten (W) by the CVD method and the surface is planarized by CMP, whereby W plugs 37, 96b indicated by broken lines in the figure are formed. At this time, the roughly u-shaped curved region 96 constituted by the bottom portion 96a and the W plug 96b connected to both ends thereof is formed.

Subsequently, after the formation of a conductive film 53, which later becomes a lower-layer interconnect, on the interlayer dielectric film 42, for example, by the sputtering method, there are continuously formed Ta/PtMn/CoFe/Ru/CoFe/AlOx/NiFe/Ta and a cap film 54 of SiN or the like by the sputtering method. For AlOx, oxidation is controlled with an oxygen radical, for example.

Subsequently, as shown in FIG. 16D, Ta/PtMn/CoFe/Ru/CoFe/AlOx/NiFe/Ta and the cap film 54 are patterned by photolithography, whereby a TMR element 11 constituted by a ferromagnetic material layer 32, an insulating layer 31 and a ferromagnetic material layer 33 is formed. Upon this TMR element 11, the cap film 54 is similarly patterned. After that, the TMR element 11 is connected to the W plug 37 and the conductive film 53 is patterned by photolithography in the form of an interconnect which performs isolation of the elements, whereby a lower interconnect 35 is formed.

Subsequently, as shown in FIG. 16E, by using the CVD method SiO$_2$ is deposited thick (in a thickness of 0.1 μm or so) so as to cover the TMR element 11, whereby an interlayer dielectric film 41 is formed.

Subsequently, as shown in FIG. 16F, so that the surface of each W plug 40b is exposed, interconnect trenches 101a, 101b (the left figure) and interconnect trenches 102a, 102b (the right figure) each having a depth of 0.1 μm or so are formed on the interlayer dielectric film 41 by photolithography. The interconnect trenches 101a, 101b are trenches for forming each linear region 94 of a bit line 91, and the interconnect trenches 102a, 102b are trenches for forming each linear region 97 of a word line 95. The interconnect trenches 101a, 101b and the interconnect trenches 102a, 102b are formed so as to be orthogonal to each other. At this time, the TMR element 11 is covered with an interlayer dielectric film 41.

Subsequently, as shown in FIG. 16G, as barrier metals, for example, a Ta film (not shown) and a seed Cu film (not shown) are caused to grow by the sputtering method in film thicknesses of, respectively, 30 nm or so and 100 nm or so in the interior of the interconnect trenches 101a, 101b and 102a, 102b, and a Cu film 59 is formed by the plating method, whereby the interconnect trenches 101a, 101b and 102a, 102b are completely buried.

Figure 17A:
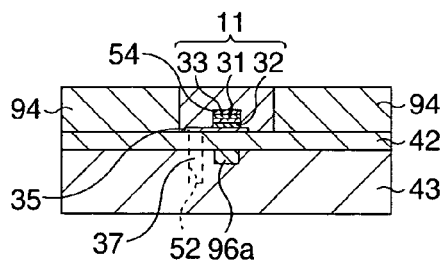
FIG. 17A is a schematic sectional view which shows a method of manufacturing an MRAM according to the Third Embodiment in order of steps.
Figure 17A:
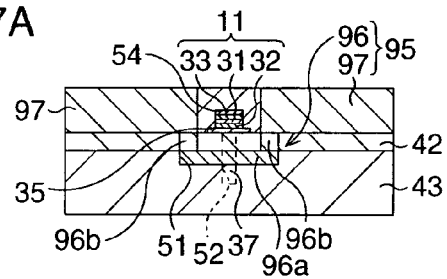

Subsequently, as shown in FIG. 17A, until the surface layer of the interlayer dielectric film 41 is removed, the Cu on the surface is removed by polishing by CMP to perform planarization, whereby each linear region 94 obtained by filling the interconnect trenches 101a, 101b is formed and each linear region 97 obtained by filling the interconnect trenches 102a, 102b is formed. At this time, as shown in the right figure, the linear region 97 and the curved region 96 are connected and integrated, whereby the word line 95 is formed.

Figure 17B:
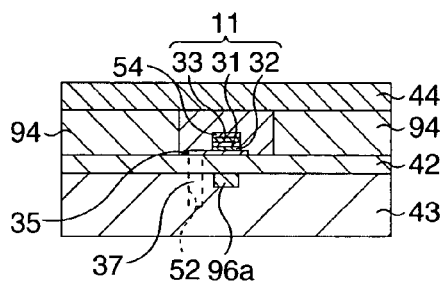
FIG. 17B is a schematic sectional view which shows a method of manufacturing an MRAM according to the Third Embodiment in order of steps.
Figure 17B:
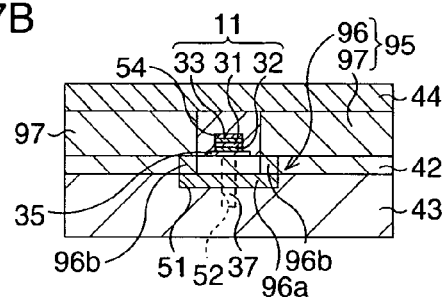

Subsequently, as shown in FIG. 17B, an interlayer dielectric film 44 is formed by depositing SiO$_2$ in a film thickness of 0.3 μm or so on the interlayer dielectric film 41 planarized by the CVD method, the linear region 94 and the linear region 97.

Figure 17C:
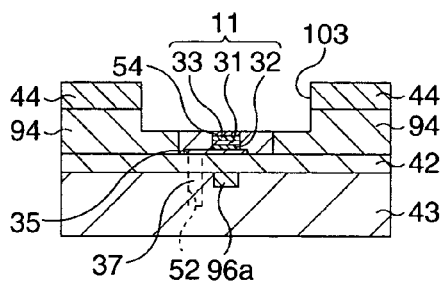
FIG. 17C is a schematic sectional view which shows a method of manufacturing an MRAM according to the Third Embodiment in order of steps.
Figure 17C:
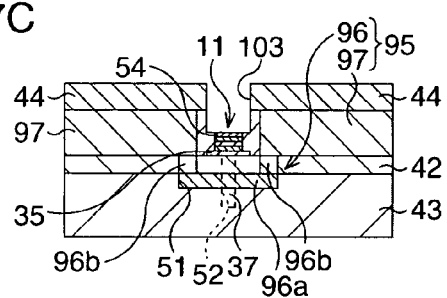

Subsequently, as shown in FIG. 17C, an interconnect trench 103 with a depth of 0.4 nm or so is formed by photolithography in the interlayer dielectric film 44 to such an extent that the top surface of the TMR element 11 is exposed and surface layers of edge portions of each linear region 94 are hollowed a little. This interconnect trench 103 is a trench for forming the top portion 92 which defines the curved region 93 of the bit line 91 and is formed with a depth of 0.4 nm or so and, therefore, the top surface of the TMR element 11 is positively exposed to the bottom surface of the interconnect trench 103.

Figure 17D:
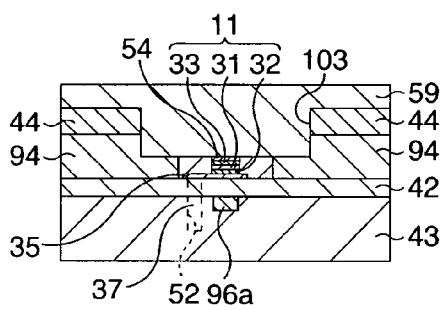
FIG. 17D is a schematic sectional view which shows a method of manufacturing an MRAM according to the Third Embodiment in order of steps.
Figure 17D:
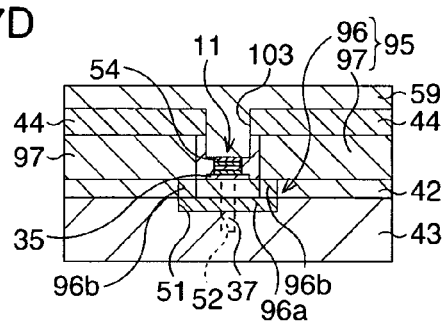

Subsequently, as shown in FIG. 17D, as barrier metals, for example, a Ta film (not shown) and a seed Cu film (not shown) are caused to grow by the sputtering method in film thicknesses of, respectively, 30 nm or so and 100 nm or so, and a Cu film 59 is formed by the plating method in a film thickness of 0.8 μm or so, whereby the interconnect trench 103 is completely buried.

Figure 17E:
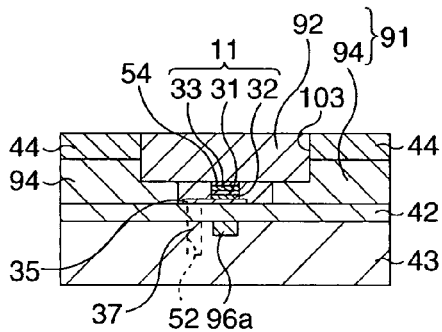
FIG. 17E is a schematic sectional view which shows a method of manufacturing an MRAM according to the First Embodiment in order of steps.
Figure 17E:
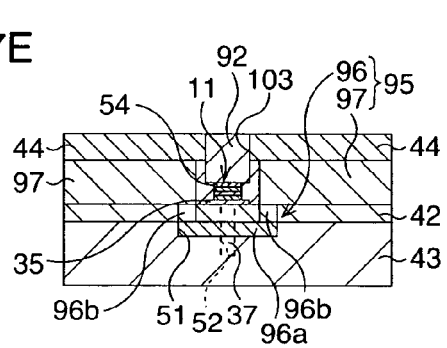

Subsequently, as shown in FIG. 17E, until the surface layer of the interlayer dielectric film 44 is removed, the Cu film 59 on the surface is removed by polishing by CMP to perform planarization, whereby the interconnect trench 103 is filled with Cu and there is formed the top portion 92 which, along with the connection area 94a of the linear region 94, constitutes the curved region 93 of the roughly inverted U-shaped curved region 93. At this time, the linear curved region 94 and the top portion 92 are connected and integrated, whereby the bit line 91 is formed.

After that, an MRAM is completed after the formation of a protective film and the like, which are not shown.

As described above, in the MRAM of this embodiment, the bit line 91 has the local curved region 93 surrounding the TRM element 11 and the word line 95 has the local curved region 96 spaced from the TMR element 11 so as to surround the TMR element 11. Thanks to this construction it is possible to cause magnetic fields to be concentrated on the TRM element 11. Therefore, it is possible to realize substantial power savings during data writing into the memory cell 1 while meeting requirements for further miniaturization of the MRAM.

Fourth Embodiment

This embodiment exemplifies what is called a cross-point type MRAM in which a U-shaped curved region is formed in both of a word line and a bit line, respectively.

Figure 18:
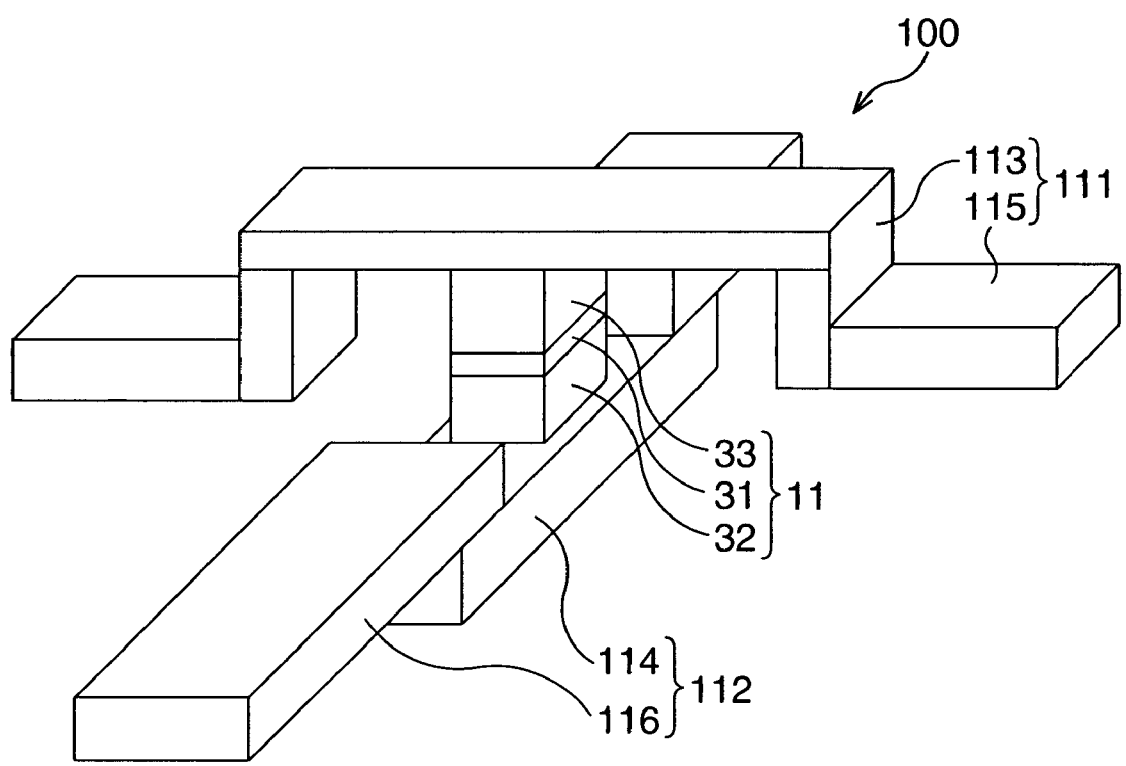
FIG. 18 is a perspective view which shows the general construction of an MRAM according to the Fourth Embodiment.

FIG. 18 is a perspective view which shows the general construction of an MRAM according to the Fourth Embodiment. In FIG. 18, for the sake of convenience, only one cell is shown and the illustrations of various kinds of insulating films and interlayer dielectric films are omitted.

In this MRAM, a plurality of memory cells 100 are disposed, for example, in a matrix manner to form a memory cell array. Each of the memory cells 100 is a memory part provided with a TMR element 11 comprising an MTJ and it is possible to select a desired memory cell 100 without having a selection transistor.

This memory cell 100 is provided with the TMR element 11 which has ferromagnetic material layers 32, 33, and supports a thin insulating layer 31 by sandwiching the thin insulating layer 31, a bit line 111 connected to the ferromagnetic material layer 33, which is an upper layer of the TMR element 11, and a word line 112 connected to the ferromagnetic material layer 32, which is a lower layer of the TMR element 11.

The TMR element 11 is composed, in order from the lower layer, of Ta (40 nm)/PtMn (15 nm)/CoFe (2 nm)/Ru (0.9 nm)/CoFe (3 nm)/AlOx (1.2 nm)/NiFe (6 nm)/Ta (30 nm), for example. Ta is an electrode layer, PtMn is an antiferromagnetic material layer, COFe and NiFe are ferromagnetic material layers, and AlOx is an insulating layer. Therefore, in the illustrated example, the construction is as follows: an electrode layer (not shown)/an antiferromagnetic material layer (not shown), the ferromagnetic material layer 32/the insulating layer 31/the ferromagnetic material layer 33/an electrode layer (not shown).

In the bit line 111, a local curved region 113 surrounding the TMR element 11 is formed. This curved region 113 is in bent shape, with, the TMR element 11 serving as a center, in this case, in roughly inverted U shape.

In the word line 112, a local curved region 114 surrounding the TMR element 11 is formed. This curved region 114 is in bent shape, with the TMR element 11 serving as a center, in this case, in rough U shape.

Each linear region 115 of the bit line 111 except the curved region 113 is an area extending linearly, and each linear region 116 of the word line 112 except the curved region 114 is an area extending linearly. The TMR element 11, each linear region 113 of the bit line 111, and the curved region 114 of the word line 112 are all disposed in the same hierarchical position (on the same plane), and the linear region 115 and the linear region 116 are orthogonal to each other. Thanks to this interconnect construction, the number of layers of the memory cell 100 decreases, permitting further miniaturization of the memory cell 1, with the result that high-density layouts of the memory cell array and an increase in the strength of composite magnetic fields are realized.

The sizes of the bit line 111 and word line 112 may be larger than 0.18 µm. For example, the bit line 111 and the word line 112 may be formed with a width of 0.35 µm or so corresponding to the integration level of the memory cell.

As described above, in the MRAM of this embodiment, the bit line 111 has the local curved region 113 surrounding the TMR element 11 and the word line 112 has the local curved region 114 surrounding the TMR element 11. Thanks to this construction it is possible to cause the magnetic fields to be concentrated on the TMR element 11. Therefore, it is possible to realize substantial power savings during data writing into the memory cell 100 while meeting requirements for further miniaturization of the MRAM. Moreover, the MRAM of this embodiment is a cross-point type and the memory cell has no selection transistor and, therefore, further miniaturization and high-density designs become possible.

INDUSTRIAL APPLICABILITY

According to the present invention, thanks to a relatively simple construction, a highly reliable MRAM is realized which ensures that power is substantially saved during data writing into a memory cell while meeting requirements for further miniaturization of the device.

What is claimed is:

1. A magnetic storage device, comprising:
a magnetic storage element having a tunnel barrier layer, a lower ferromagnetic material layer and an upper ferromagnetic material layer, where the lower and upper ferromagnetic material layers sandwich the tunnel barrier layer; and
a pair of interconnects which are in mutually twisted positions above and below the magnetic storage element, being insulated and separated from each other,
wherein the interconnect positioned above the magnetic storage element of the pair of interconnects is coupled to the upper ferromagnetic material layer, and the interconnect positioned below the magnetic storage element of the pair of interconnects is insulated from the lower ferromagnetic material layer;
wherein the lower ferromagnetic material layer is coupled to a selection transistor; and
wherein at least one of the pair of interconnects includes a local curved portion, which is spaced from the magnetic storage element so as to surround the magnetic storage element.

2. The magnetic storage device according to claim 1, wherein the magnetic storage element is a magneto-tunnel junction of at least three-layer construction which has a lower ferromagnetic material layer and an upper ferromagnetic material layer, which sandwich a tunnel barrier layer.

3. The magnetic storage device according to claim 1, wherein the curved portion is formed in the form of a circular arc, with the magnetic storage element serving as a center.

4. The magnetic storage device according to claim 1, wherein the curved portion is formed in bent form, with the magnetic storage element serving as a center.

5. The magnetic storage device according to claim 1, wherein the pair of interconnects are such that one has the curved portion and the other is linearly formed.

6. The magnetic storage device according to claim 1, wherein the pair of interconnects are such that both have the curved portion.

7. The magnetic storage device according to claim 1, wherein the pair of interconnects are orthogonal to each other as viewed on a plane.

8. The magnetic storage device according to claim 1, wherein the interconnects formed in the curved region include the magnetic storage element in the interior of a space formed by the curved portion.

9. The magnetic storage device according to claim 1, wherein the magnetic storage device includes a selection element for selecting the magnetic storage element which corresponds to the magnetic storage element.

10. The magnetic storage device according to claim 1, wherein the pair of interconnects are connected to the magnetic storage element so as to support the magnetic storage element by sandwiching the magnetic storage element from above and below.

11. The magnetic storage device according to claim 1, wherein the pair of interconnects lie in the same plane in areas other than the curved portion.

12. The magnetic storage device according to claim 1, wherein the pair of interconnects and the magnetic storage element lie in the same plane in areas other than the curved portion.

13. The magnetic storage device according to claim 1, wherein a magnetic-film-clad layer is formed so as to cover at least part of the pair of interconnects.

* * * * *